US011334163B1

(12) United States Patent
Piazza et al.

(10) Patent No.: US 11,334,163 B1
(45) Date of Patent: May 17, 2022

(54) SPIRAL HAPTIC VIBROTACTILE ACTUATORS AND RELATED SYSTEMS AND METHODS

(71) Applicant: Facebook Technologies, LLC, Menlo Park, CA (US)

(72) Inventors: Daniele Piazza, Redmond, WA (US); Tristan Thomas Trutna, Seattle, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 248 days.

(21) Appl. No.: 16/788,597

(22) Filed: Feb. 12, 2020

Related U.S. Application Data

(60) Provisional application No. 62/845,850, filed on May 9, 2019.

(51) Int. Cl.
| | |
|---|---|
| *G08B 6/00* | (2006.01) |
| *G06F 3/01* | (2006.01) |
| *G02B 27/01* | (2006.01) |
| *G06F 1/16* | (2006.01) |
| *H01L 41/09* | (2006.01) |

(52) U.S. Cl.
CPC ......... *G06F 3/016* (2013.01); *G02B 27/0172* (2013.01); *G06F 1/163* (2013.01); *G08B 6/00* (2013.01); *H01L 41/0926* (2013.01)

(58) Field of Classification Search
CPC ........................................................ G06F 3/016
See application file for complete search history.

(56) References Cited

U.S. PATENT DOCUMENTS

| | | | | |
|---|---|---|---|---|
| 2016/0179199 A1* | 6/2016 | Levesque | ................. | G06F 3/014 340/407.2 |
| 2017/0193760 A1* | 7/2017 | Levesque | ............... | G07F 7/0833 |
| 2018/0102030 A1* | 4/2018 | Khoshkava | ............ | H02K 35/00 |
| 2018/0120939 A1* | 5/2018 | Khoshkava | ............. | G06F 3/016 |
| 2019/0339776 A1* | 11/2019 | Rosenberg | .............. | G06F 3/016 |
| 2020/0019245 A1* | 1/2020 | Ganadas | ................. | G06F 3/016 |

* cited by examiner

*Primary Examiner* — Joseph H Feild
*Assistant Examiner* — Pameshanand Mahase
(74) *Attorney, Agent, or Firm* — FisherBroyles, LLP

(57) ABSTRACT

The disclosed flexible vibrotactile devices may include a flexible electroactive material that has a substantially spiral shape, a first electrode electrically coupled to a first side of the flexible electroactive material, and a second electrode electrically coupled to a second, opposite side of the flexible electroactive material. The first electrode and the second electrode may be positioned and configured to apply an electrical voltage to the flexible electroactive material to induce haptic vibration in the flexible electroactive material. Various other related methods and systems are also disclosed.

19 Claims, 16 Drawing Sheets

1000

Form a flexible electroactive material to exhibit a substantially spiral shape
1010

↓

Electrically couple a first electrode to a first side of the flexible electroactive material
1020

↓

Electrically couple a second electrode to a second, opposite side of the flexible electroactive material
1030

↓

Support the flexible electroactive material with a wearable article in a position to induce haptic vibrational feedback to an intended user donning the wearable article upon application of a voltage via the first electrode and the second electrode
1040

*FIG. 10*

SPIRAL HAPTIC VIBROTACTILE ACTUATORS AND RELATED SYSTEMS AND METHODS

CROSS REFERENCE TO RELATED APPLICATION

This application claims the benefit of U.S. Provisional Application No. 62/845,850, filed on May 9, 2019, the disclosure of which is incorporated, in its entirety, by this reference.

BRIEF DESCRIPTION OF THE DRAWINGS

The accompanying drawings illustrate a number of example embodiments and are a part of the specification. Together with the following description, these drawings demonstrate and explain various principles of the present disclosure.

FIG. 10 is a flow diagram illustrating a method of fabricating a wearable haptic system according to at least one embodiment of the present disclosure.

Figure 1:
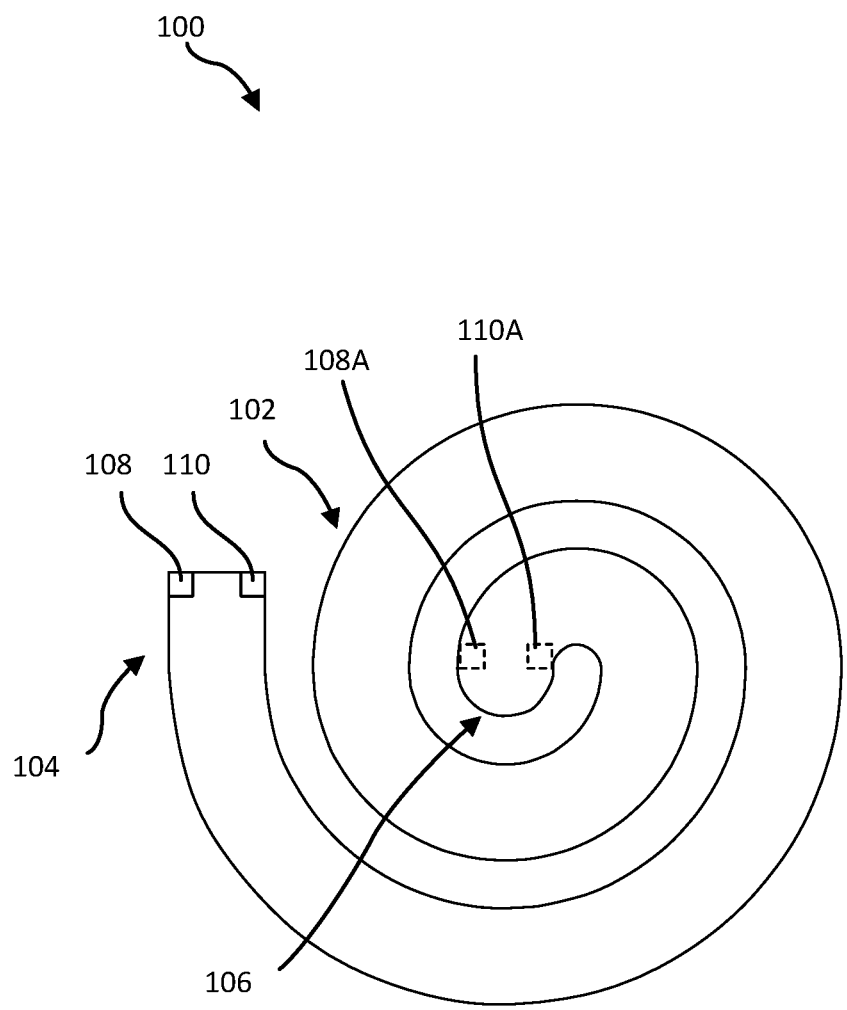
FIG. 1 is a plan view of a haptic vibrotactile actuator according to at least one embodiment of the present disclosure.

Throughout the drawings, identical reference characters and descriptions indicate similar, but not necessarily identical, elements. While the example embodiments described herein are susceptible to various modifications and alternative forms, specific embodiments have been shown by way of example in the drawings and will be described in detail herein. However, the example embodiments described herein are not intended to be limited to the particular forms disclosed. Rather, the present disclosure covers all modifications, equivalents, and alternatives falling within the scope of the appended claims.

DETAILED DESCRIPTION OF EXAMPLE EMBODIMENTS

Vibrotactile devices include devices that may vibrate to provide haptic feedback to a user of a device. For example, some modern mobile devices (e.g., cell phones, tablets, mobile gaming devices, gaming controllers, etc.) include a vibrotactile device that informs the user through a vibration that an action has been taken. The vibration may indicate to the user that a selection has been made or a touch event has been sensed. Vibrotactile devices may also be used to provide an alert or signal to the user.

Various types of vibrotactile devices exist, such as piezoelectric devices, eccentric rotating mass devices, and linear resonant actuators. Such conventional vibrotactile devices may include one or more elements that vibrate upon application of an electrical voltage. In the case of piezoelectric devices, an applied voltage may induce bending or other displacement in a piezoelectric material. Eccentric rotating mass devices induce vibration by rotating an off-center mass around an axle of an electromagnetic motor. Linear resonant actuators may include a mass on an end of a spring that is driven by a linear actuator to cause vibration. Many of these conventional vibrotactile devices are rigid and inflexible. The amplitude and frequency response range of vibrations in conventional vibrotactile devices is often limited by geometry, mass, or electrical control. For example, a longer piezoelectric vibrotactile device may generally be capable of vibrations having higher amplitudes than a similar shorter piezoelectric vibrotactile device.

According to some embodiments, the present disclosure is generally directed to a flexible, spiral-shaped haptic vibrotactile actuator, which may enable a higher output (e.g., displacement, vibration, or frequency response) due to an increased length in a tight space. For example, the spiral haptic vibrotactile actuator may be positioned in a palm or finger portion of a haptic glove or in another wearable article in a position to induce haptic vibrational feedback to a user when the wearable article is donned by the user. The spiral haptic vibrotactile actuator may be formed of, for example, an electroactive material (e.g., a piezoelectric or electroactive polymer ("EAP") material) that may be flexible for integration in a wearable article. Such a flexible haptic vibrotactile actuator may have a larger displacement per unit of size compared to other (e.g., non-spiral) configurations of a similar size.

Figure 8:
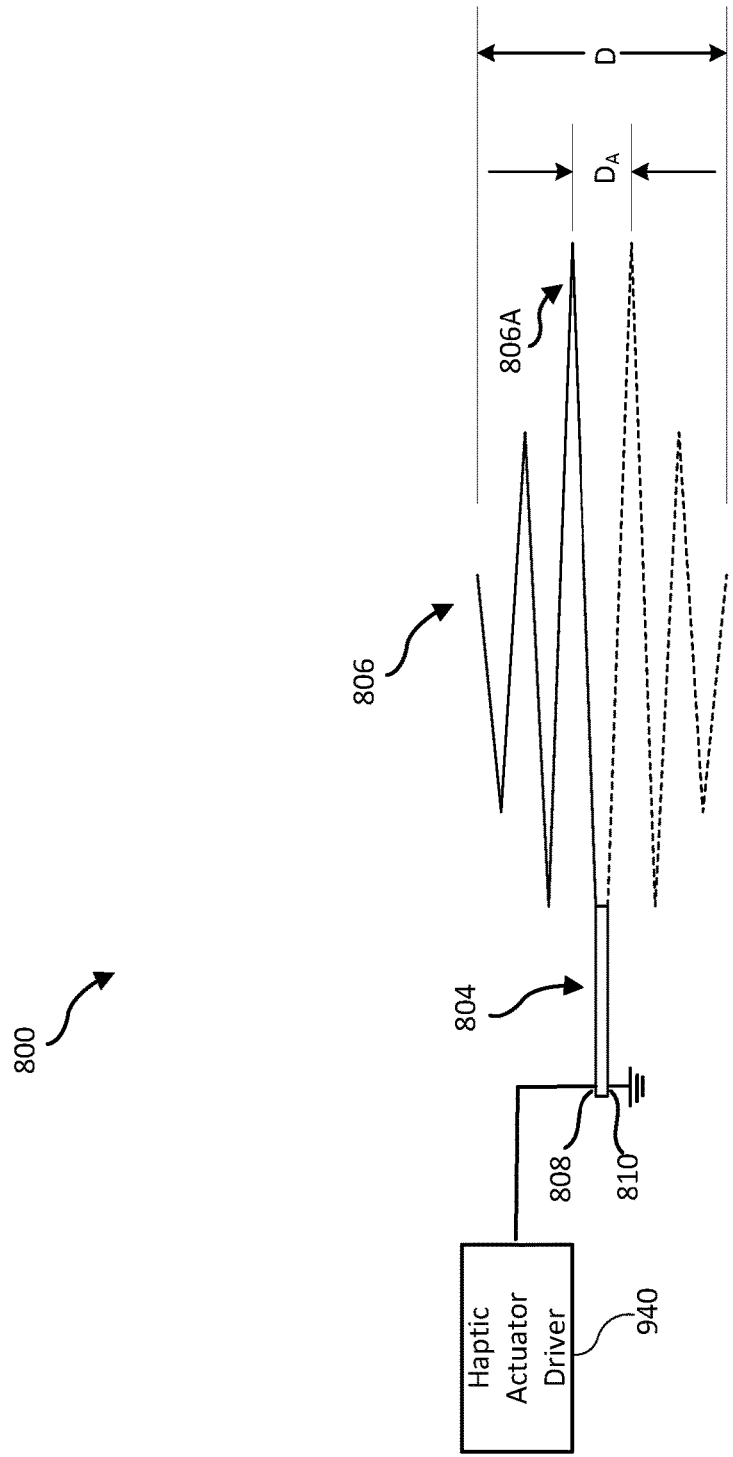
FIG. 8 is a side schematic view of a haptic vibrotactile actuator in an activated state, according to at least one embodiment of the present disclosure.
Figure 9:
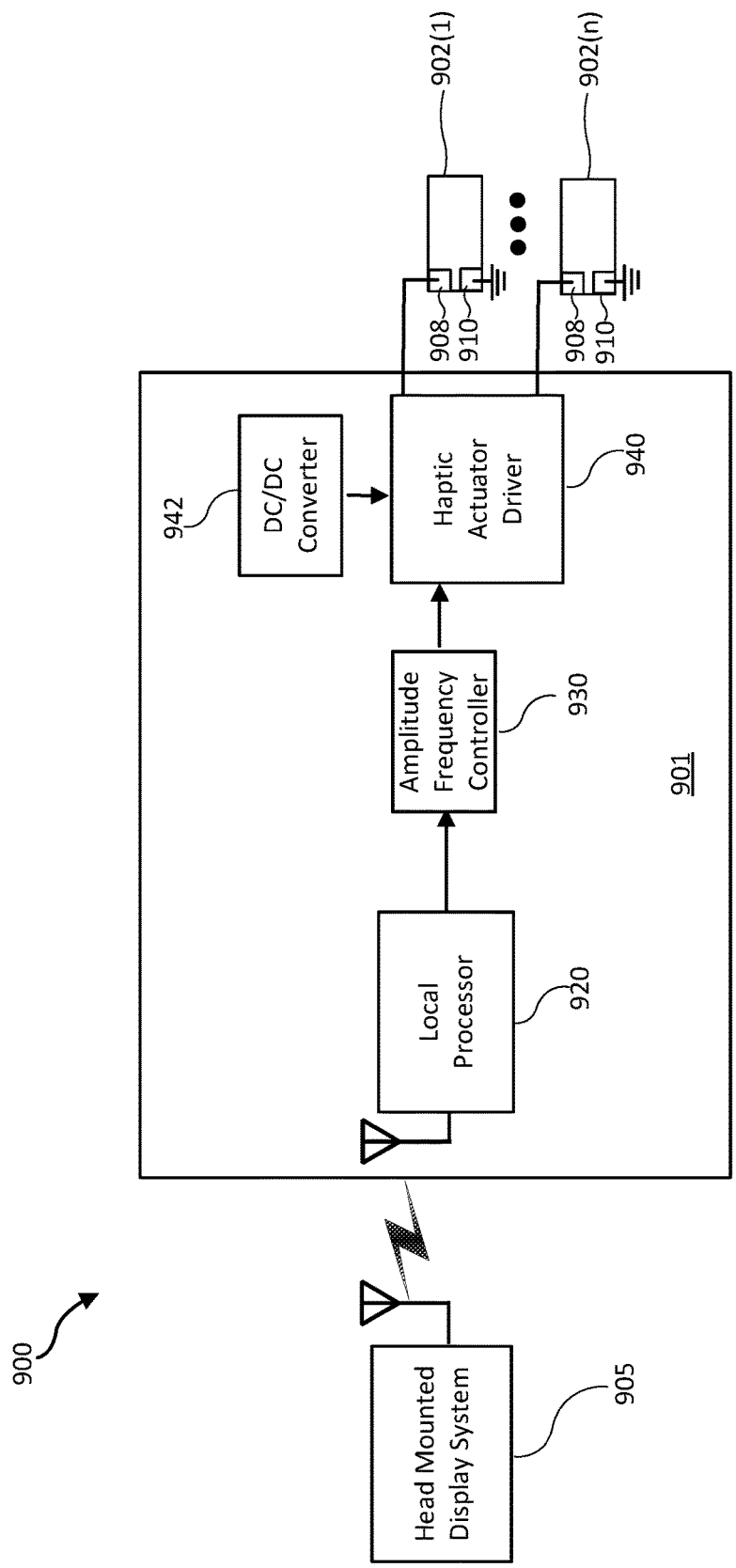
FIG. 9 is a block diagram of an artificial-reality system including a haptic vibrotactile actuator, according to at least one embodiment of the present disclosure.

The following will provide, with reference to FIGS. 1-16, detailed descriptions of spiral haptic vibrotactile actuators and related systems and methods. First, a description of various spiral-shaped haptic vibrotactile actuators and their characteristics is presented in reference to FIGS. 1-7. FIG. 8 illustrates displacement advantages of spiral-shaped haptic vibrotactile actuators. FIG. 9 illustrates an artificial-reality system that includes spiral-shaped haptic vibrotactile actuators and a haptic controller. FIG. 10 illustrates a method of fabricating a wearable haptic system including spiral-shaped haptic vibrotactile actuators. FIGS. 11-16 illustrate various types of example artificial-reality devices that may be used with a wearable article including spiral-shaped haptic vibrotactile actuators.

The embodiments of the present disclosure may find certain advantages in an artificial-reality environment, such as simulating a tactile sensation by providing haptic feedback. However, the disclosed embodiments may also be used in a variety of other environments, including but not limited to gaming, industrial simulators, robotics, and any suitable environment where simulating a tactile sensation by providing haptic feedback is desired.

FIG. 1 illustrates a haptic vibrotactile actuator 100 that has a substantially spiral shape. Haptic vibrotactile actuator 100 may include a flexible electroactive material 102 that has an outer end 104 and an inner end 106. A first electrode 108 may be electrically coupled to a first side (e.g., an upper side) of flexible electroactive material 102 and a second electrode 110 may be electrically coupled to a second, opposite side (e.g., a lower side) of flexible electroactive material 102. Thus, first electrode 108 and second electrode 110 may be positioned and configured to apply an electrical voltage to flexible electroactive material 102 to induce haptic vibration in flexible electroactive material 102. As shown in FIG. 1, first electrode 108 and second electrode 110 may be positioned at or near outer end 104 of flexible electroactive material 102. Additionally or alternatively, a first electrode 108A and/or a second electrode 110A may be positioned at or near inner end 106 of flexible electroactive material 102, as shown by dashed lines in FIG. 1. First electrodes 108, 110 and/or second electrodes 108A, 110A may include an electrically conductive material, such as, without limitation, copper, gold, platinum, silver, palladium, or a combination thereof. Since flexible electroactive material 102 may deform, deflect, and/or vibrate when activated by an electrical voltage, in some embodiments first electrodes 108, 110 and/or second electrodes 108A, 110A may conform to the shape of flexible electroactive material 102. Thus, in some embodiments, first electrodes 108, 110 and/or second electrodes 108A, 110A may be compliant to flexible electroactive material 102 and may be capable of maintaining electrical contact with an interconnection mechanism (e.g., wires, a harness, etc.) to a haptic actuator controller (e.g., the haptic actuator controller described below with reference to FIG. 9) even at the deflections and vibrations encountered with spiral-shaped haptic vibrotactile actuators of the present disclosure.

Figure 2:
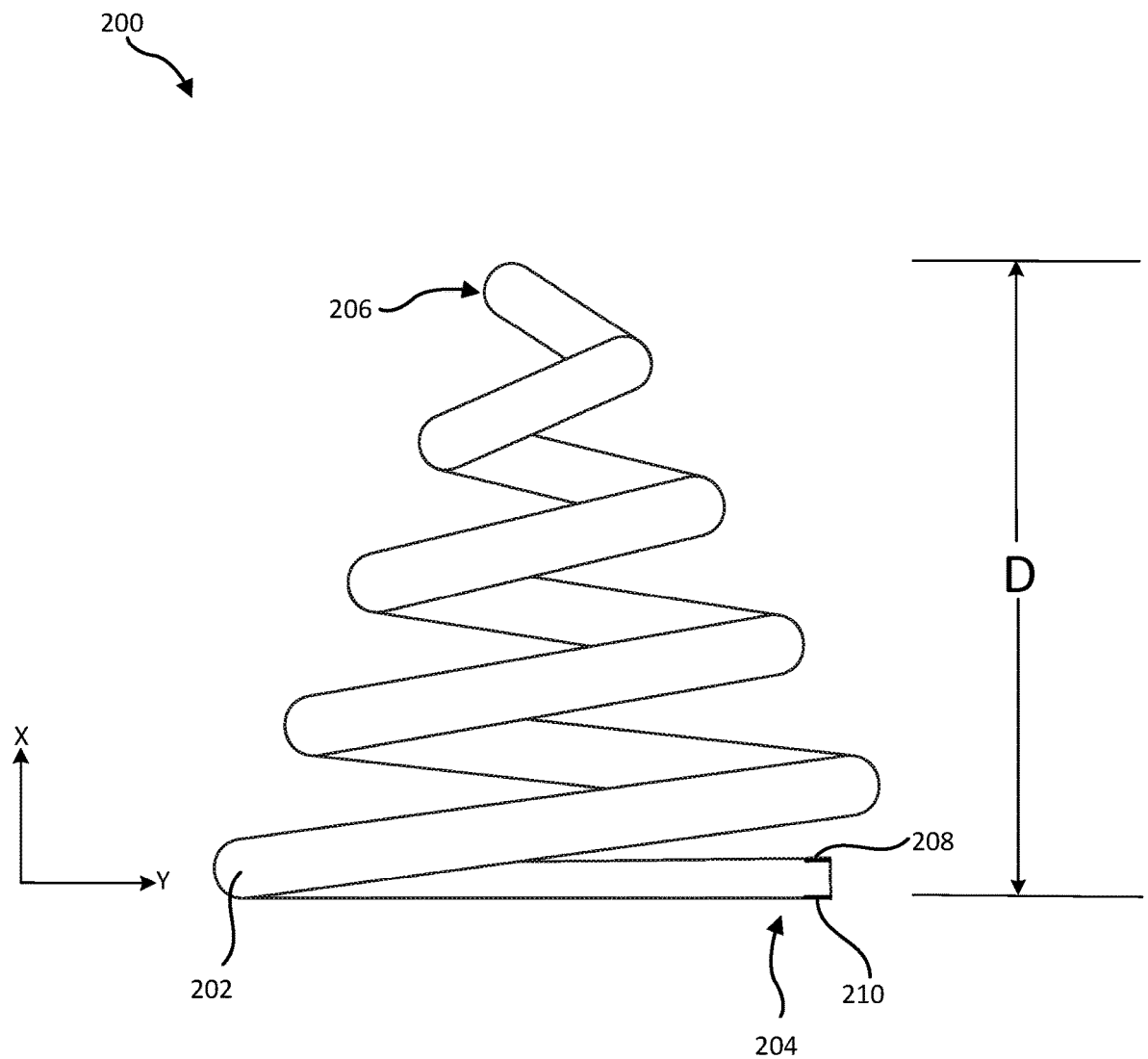
FIG. 2 is a side view of a haptic vibrotactile actuator in an activated state, according to at least one embodiment of the present disclosure.

Flexible electroactive material 102 may be any suitable material that may withstand bending, vibrating, and/or deformation due to external forces (e.g., forces associated with use in a wearable article, such as a glove) without damage and that is configured to deform in response to application of a sufficient voltage to first and second electrodes 108, 110 and/or first and second electrodes 108A, 110A. By way of example and not limitation, flexible electroactive material 102 may include one or more of the following: an EAP material, a dielectric elastomer material, a relaxor ferroelectric material, a piezoelectric ceramic material, an ionic gel, a piezoelectric polycrystalline material, and/or a piezoelectric single-crystal material. Flexible electroactive material 102 may have a thickness of about 150 μm or less, about 125 μm or less, about 100 μm or less, about 75 μm or less, or about 50 μm or less, such as to improve a flexibility thereof (compared to thicker electroactive materials). In some examples, flexible electroactive material 102 may be substantially planar in the absence of an applied electrical voltage or external physical load. When a sufficient voltage is applied (e.g., via first and second electrodes 108, 110), flexible electroactive material 102 may deform out of the initial plane (e.g., in the absence of an applied voltage) as shown in the examples of FIGS. 2 and 8. Haptic vibrotactile actuator 100 may be configured to vibrate in a first direction out-of-plane relative to the substantially planar spiral shape and in a second direction different from the first direction and out-of-plane relative to the substantially planar spiral shape. As illustrated in FIG. 1 by way of example, haptic vibrotactile actuator 100 may have a circular spiral shape. In some examples, haptic vibrotactile actuator 100 may have an elliptical spiral shape.

Flexible electroactive material 102 may include a single electroactive material (with or without an electrically insulating substrate material) in a so-called "unimorph" configuration, or may include a first electroactive material and a second electroactive material in a so-called "bimorph" configuration. In embodiments in which flexible electroactive material 102 is configured as a bimorph, an electrically conductive (e.g., a ground, an electrode, etc.) material and/or an electrically insulating material may be positioned between the first and second electroactive materials. In some examples, by arranging multiple layers of flexible electroactive material in parallel (e.g., stacking layers), the resulting actuation force may be multiplied and the stiffness of haptic vibrotactile actuator 100 may be increased.

In some examples, haptic vibrotactile actuator 100 may include multiple layers (e.g., strips) of flexible electroactive material 102 positioned adjacent to and parallel to each other with an electrically insulating material positioned between each of the multiple layers of flexible electroactive materials 102. Positioning multiple layers of flexible electroactive material separated by electrically insulating materials (e.g., stacking) may in part determine the operating characteristics of haptic vibrotactile actuator 100. For example, stacking layers of flexible electroactive material 102 separated by electrically insulating materials in haptic vibrotactile actuator 100 may affect (e.g., increase or decrease) the displacement, vibration characteristics, frequency response, actuation force, or a combination thereof in haptic vibrotactile actuator 100 when an electrical voltage is applied to first and second electrodes 108 and 110.

In some examples, haptic vibrotactile actuator 100 may be directly attached and secured to a wearable article (e.g., the inside surface of a glove) and be positioned and configured to apply haptic feedback (e.g., vibrations of varying frequency, intensity, pattern, etc.) to a user donning the article. Haptic vibrotactile actuator 100 may be capable of conforming to one or more features of a human body, such as, but not limited to, a human finger, hand, wrist, arm, head, torso, foot, or leg when haptic vibrotactile actuator 100 is integrated into a wearable article and worn by a human. Haptic vibrotactile actuator 100 may be directly attached and secured to the wearable article using methods including, without limitation, stenciling, screen printing, inkjet technology, 3-D printing, or a combination thereof.

In some examples, haptic vibrotactile actuator 100 may be attached and/or secured to a structural support material (e.g., a flexible dielectric support material) and may include mounting holes to secure haptic vibrotactile actuator 100 to the wearable article. The structural support material may be secured to the wearable article via a fiber threaded through the mounting holes. Alternatively or additionally, haptic vibrotactile actuator 100 may be attached to the structural support material via adhesive, by at least partially positioning the haptic vibrotactile actuator 100 in a pocket, or by using another suitable attachment technique.

Although the electromechanical coupling in flexible electroactive material 102 may be well-suited for haptic vibrotactile actuator 100, the low-moduli and high-strain capabilities and the ability to conform to surfaces of different shapes may also make flexible vibrotactile material 102 well-suited for applications such as wearable sensors. The ergonomic comfort, elasticity, and piezoelectric characteristics of flexible electroactive material 102 may be well-suited for sensing in wearable articles (e.g., e-textiles, such as artificial-reality gloves). In some examples, flexible electroactive material 102 may sense mechanical properties including, without limitation, displacement, force, temperature, stress, strain, pressure, or a combination thereof. Such mechanical properties may be sensed by converting mechanical energy to electrical energy in flexible electroactive material 102. For example, a displacement, deformation, pressure, stretch, stress, or strain applied to flexible electroactive material 102 may produce an electrical voltage and/or current (e.g., electrical energy output proportional to the mechanical energy) at first and second electrodes 108, 110 that may be sensed by a controller such as haptic controller 901 of FIG. 9. The stiffness, deflection, current, voltage, and frequency response of flexible electroactive material 102 may be configured by adjusting the material composition, length, width, thickness, or a combination thereof in flexible electroactive material 102. In some examples, flexible electroactive material 102 may act as both an actuator (e.g., applying haptic feedback to an AR/VR user) and a sensor. A controller may switch flexible electroactive material 102 between actuator and sensor functions in applications such as artificial reality.

FIG. 2 is a side view of a haptic vibrotactile actuator 200 in an activated state. Haptic vibrotactile actuator 200 may have at least some of the characteristics of haptic vibrotactile actuator 100 of FIG. 1. For example, haptic vibrotactile actuator 200 may include a flexible electroactive material 202 that has an outer end 204 and an inner end 206. A first electrode 208 may be electrically coupled to a first side (e.g., an upper side) of flexible electroactive material 202 and a second electrode 210 may be electrically coupled to a second, opposite side (e.g., a lower side) of flexible electroactive material 202. Thus, first electrode 208 and second electrode 210 may be positioned and configured to apply an electrical voltage to flexible electroactive material 202 to induce haptic vibration in flexible electroactive material 202. When a sufficient voltage is applied to first electrode 208 and second electrode 210, haptic vibrotactile actuator 200 may bend, deform, or expand in a direction parallel to the X axis into a substantially conical spiral shape. Haptic vibrotactile actuator 200 may expand in the X axis direction for a displacement distance D (e.g., a distance from outer end 204 to inner end 206 along the X axis) when actuated by a positive voltage applied to first electrode 208 and second electrode 210. Haptic vibrotactile actuator 200 may expand in the opposite direction (e.g., negative X axis direction) when actuated by a negative voltage applied to first electrode 208 and second electrode 210. By applying an alternating polarity voltage to first electrode 208 and second electrode 210, haptic vibrotactile actuator 200 may vibrate out of plane (e.g., Y axis) substantially parallel to the X axis.

As described in detail below with respect to FIG. 8, haptic vibrotactile actuator 200 may exhibit a relatively large displacement D when activated, due to the increased length of haptic vibrotactile actuator 200 in the spiral configuration as compared to a similar actuator that may have a linear configuration in the same or similar space.

Figure 3:
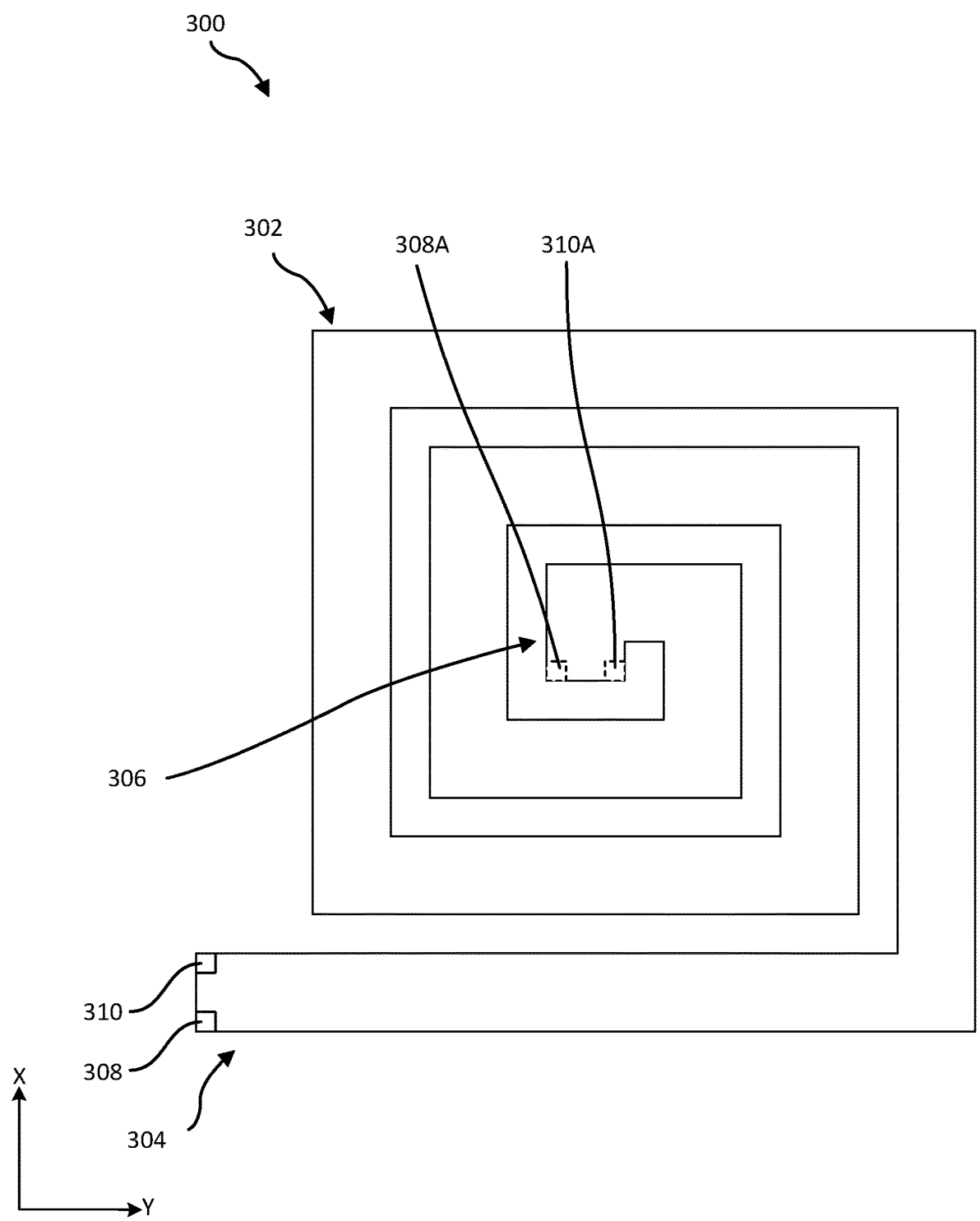
FIG. 3 is a plan view of a haptic vibrotactile actuator according to at least one additional embodiment of the present disclosure.

FIG. 3 illustrates a haptic vibrotactile actuator 300 according to additional embodiments of the present disclosure. Similar to haptic vibrotactile actuator 100 described above with reference to FIG. 1, haptic vibrotactile actuator 300 of FIG. 3 may include a flexible electroactive material 302 that has an outer end 304 and an inner end 306. A first electrode 308 may be electrically coupled to a first side (e.g., an upper side) of flexible electroactive material 302 and a second electrode 310 may be electrically coupled to a second, opposite side (e.g., a lower side) of flexible electroactive material 302. Thus, first electrode 308 and second electrode 310 may be positioned and/or configured to apply an electrical voltage to flexible electroactive material 302 to induce haptic vibration in flexible electroactive material 302. As shown in FIG. 3, first electrode 308 and second electrode 310 may be positioned at or near outer end 304 of flexible electroactive material 302. Alternatively, a first electrode 308A and/or a second electrode 310A may be positioned at or near inner end 306 of flexible electroactive material 302, as shown by dashed lines in FIG. 3. First electrodes 308, 310 and/or second electrodes 308A, 310A may include an electrically conductive material, such as, without limitation, copper, gold, platinum, silver, palladium, or a combination thereof. Since flexible electroactive material 302 may deform, deflect, and/or vibrate when activated by an electrical voltage, in some embodiments first electrodes 308, 310 and/or second electrodes 308A, 310A may conform to the shape of flexible electroactive material 302. Thus, in some embodiments, first electrodes 308, 310 and/or second electrodes 308A, 310A may be compliant to flexible electroactive material 302 and may be capable of maintaining electrical contact with an interconnection mechanism (e.g., wires, harness, etc.) to a haptic actuator controller (e.g., haptic actuator controller 901 of FIG. 9) even at the deflections and vibrations encountered with spiral-shaped haptic vibrotactile actuators of the present disclosure.

Flexible electroactive material 302 may be any suitable material that may withstand bending, vibrating and/or deformation due to external forces (e.g., forces associated with use in a wearable article, such as a glove) without damage and that is configured to deform in response to application of a sufficient voltage to first and second electrodes 308, 310 or first and second electrodes 308A, 310A. By way of example and not limitation, flexible electroactive material 302 may include one or more of the following: an EAP material, a dielectric elastomer material, a relaxor ferroelectric material, a piezoelectric ceramic material, an ionic gel, a piezoelectric polycrystalline material, and/or a piezoelectric single-crystal material. Flexible electroactive material 302 may have a thickness of about 150 μm or less, about 125 μm or less, about 100 μm or less, about 75 μm or less, or about 50 μm or less, such as to improve a flexibility thereof (compared to thicker electroactive materials). In some examples, flexible electroactive material 302 may be substantially planar in the absence of an applied electrical voltage or external physical load. When a sufficient voltage is applied (e.g., via first and second electrodes 308, 310), flexible electroactive material 302 may deform out of the initial plane (e.g., in the absence of an applied voltage) as shown in the examples of FIGS. 2 and 8. As illustrated in FIG. 3 by way of example, haptic vibrotactile actuator 300 may have a rectangular spiral shape. In some examples, haptic vibrotactile actuator 300 may have similar X and Y dimensions. In some examples, haptic vibrotactile actuator 300 may have different X and Y dimensions.

Although FIG. 1 illustrates haptic vibrotactile actuator 100 having a circular spiral shape and FIG. 3 illustrates haptic vibrotactile actuator 300 having a rectangular spiral shape, the present disclosure is not so limited. For example, haptic vibrotactile actuators of the present disclosure may have any substantially spiral shape, such as elliptical spiral, double spiral (e.g., spiraling in toward the center and out toward the edge), helical spiral, Archimedean spiral, triangular spiral, hexagonal spiral, heptagonal spiral, octagonal spiral, logarithmic spiral, parabolic spiral, or hyperbolic spiral, etc. Further, haptic vibrotactile actuators of the present disclosure may have a helical spiral shape as described below with respect to FIG. 4, a circular spiral shape with varying lateral width as described below with respect to FIG. 5, an interleaved circular spiral shape as described below with respect to FIG. 6, or a circular spiral with nonlinear radius as described below with respect to FIG. 7.

Flexible electroactive material 302 may include a single electroactive material (with or without an electrically insulating substrate material) in a so-called "unimorph" configuration, or may include a first electroactive material and a second electroactive material in a so-called "bimorph" configuration. In embodiments in which flexible electroactive material 302 is configured as a bimorph, an electrically conductive (e.g., a ground, an electrode, etc.) material and/or an electrically insulating material may be positioned between the first and second electroactive materials. In some examples, by arranging multiple layers of flexible electroactive material in parallel (e.g., stacking layers), the resulting actuation force may be multiplied and the stiffness of haptic vibrotactile actuator 300 may be increased.

In some examples, haptic vibrotactile actuator 300 may include multiple layers (e.g., strips) of flexible electroactive material 302 positioned adjacent to and parallel to each other with an electrically insulating material positioned between each of the multiple layers of flexible electroactive materials 302. Positioning multiple layers of flexible electroactive material separated by electrically insulating materials (e.g., stacking) may in part determine the operating characteristics of haptic vibrotactile actuator 300. For example, stacking layers of flexible electroactive material 302 separated by electrically insulating materials in haptic vibrotactile actuator 300 may affect (e.g., increase or decrease) the displacement, vibration characteristics, frequency response, actuation force, or a combination thereof in haptic vibrotactile actuator 300 when an electrical voltage is applied to first and second electrodes 308 and 310.

In some examples, haptic vibrotactile actuator 300 may be directly attached and secured to a wearable article (e.g., the inside surface of a glove) and be positioned and configured to apply haptic feedback (e.g., vibrations of varying frequency, intensity, pattern, etc.) to a user donning the article. Haptic vibrotactile actuator 300 may be capable of conforming to one or more features of a human body, such as, but not limited to, a human finger, hand, wrist, arm, head, torso, foot, or leg when haptic vibrotactile actuator 300 is integrated into a wearable article and worn by a human. Haptic vibrotactile actuator 300 may be directly attached and secured to the wearable article using methods including, without limitation, stenciling, screen printing, inkjet technology, 3-D printing, or a combination thereof.

In some examples, haptic vibrotactile actuator 300 may be attached and/or secured to a structural support material (e.g., a flexible dielectric support material) and may include mounting holes to secure haptic vibrotactile actuator 300 to the wearable article. The structural support material may be secured to the wearable article via a fiber threaded through the mounting holes. Alternatively or additionally, haptic vibrotactile actuator 300 may be attached to the structural support material via adhesive, by at least partially positioning the haptic vibrotactile actuator 100 in a pocket, or by using another suitable attachment technique.

Although the electromechanical coupling in flexible electroactive material 302 may be well-suited for haptic vibrotactile actuator 300, flexible electroactive material 302 may also be well-suited for applications such as wearable sensors. Haptic vibrotactile actuator 300 may have similar sensing characteristics and capabilities as described above with respect to haptic vibrotactile actuator 100 of FIG. 1.

Figure 4:
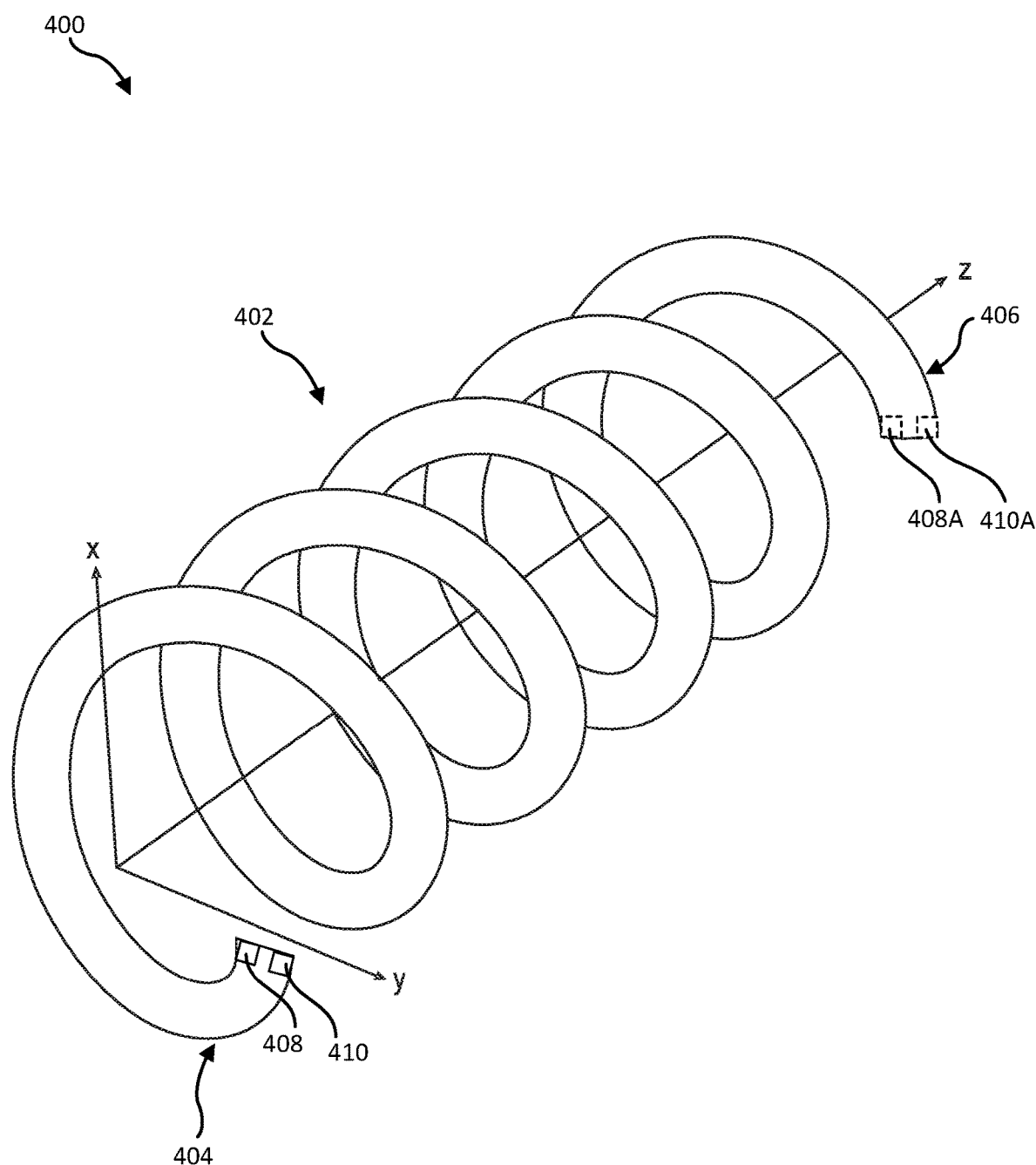
FIG. 4 is a perspective view of a haptic vibrotactile actuator, according to at least one additional embodiment of the present disclosure.

FIG. 4 illustrates a haptic vibrotactile actuator 400 according to additional embodiments of the present disclosure. Haptic vibrotactile actuators 100, 200, and 300 described above may have a capability to deform and/or vibrate along a single axis (e.g., the X axis of FIG. 4). However, the present disclosure is not limited to physical movement of a haptic vibrotactile actuator along a single axis. For example, haptic vibrotactile actuator 400 may be capable of deforming (e.g., vibrating) along the length, width, thickness, radius, or a combination thereof, of flexible electroactive material 402. As illustrated in FIG. 4 by way of example, haptic vibrotactile actuator 400 may have a circular helical shape. In some examples, haptic vibrotactile actuator 400 may have a constant radius or a radius that varies along the Z axis.

Like haptic vibrotactile actuator 100 described above with reference to FIG. 1, haptic vibrotactile actuator 400 of FIG. 4 may also include a flexible electroactive material 402 that has a first end 404 and a second end 406. A first electrode 408 may be electrically coupled to a first side (e.g., an outer side) of flexible electroactive material 402 and a second electrode 410 may be electrically coupled to a second, opposite side (e.g., an inner side) of flexible electroactive material 402. Thus, first electrode 408 and second electrode 410 may be positioned and/or configured to apply an electrical voltage to flexible electroactive material 402 to induce haptic vibration in flexible electroactive material 402. As shown in FIG. 4, first electrode 408 and second electrode 410 may be positioned at or near first end 404 of flexible electroactive material 402. Alternatively, a first electrode 408A and/or a second electrode 410A may be positioned at or near second end 406 of flexible electroactive material 402, as shown by dashed lines in FIG. 4. First electrodes 408, 410 and/or second electrodes 408A, 410A may include an electrically conductive material, such as, without limitation, copper, gold, platinum, silver, palladium, or a combination thereof. Since flexible electroactive material 402 may deform, deflect, and/or vibrate when activated by an electrical voltage, in some embodiments first electrodes 408, 410 and/or second electrodes 408A, 410A may conform to the shape of flexible electroactive material 402 in both activated and unactivated states. Thus, in some embodiments, first electrodes 408, 410 and/or second electrodes 408A, 410A may be compliant to flexible electroactive material 402 and be capable of maintaining electrical contact with an interconnection mechanism (e.g., wires, harness, etc.) to a haptic actuator controller (e.g., haptic actuator controller 901 of FIG. 9) even at the deflections and vibrations encountered with helical shaped haptic vibrotactile actuators of the present disclosure.

Flexible electroactive material 402 may be any suitable material that may withstand bending, vibrating and/or deformation due to external forces (e.g., forces associated with use in a wearable article, such as a glove) without damage and that is configured to deform in response to application of a sufficient voltage to first and second electrodes 408, 410 or first and second electrodes 408A, 410A. By way of example and not limitation, flexible electroactive material 402 may include one or more of the following: an EAP material, a dielectric elastomer material, a relaxor ferroelectric material, a piezoelectric ceramic material, an ionic gel, a piezoelectric polycrystalline material, and/or a piezoelectric single-crystal material. Flexible electroactive material 402 may have a thickness of about 150 µm or less, about 125 µm or less, about 100 µm or less, about 75 µm or less, or about 50 µm or less, such as to improve a flexibility thereof (compared to thicker electroactive materials).

In some examples, flexible electroactive material 402 may be substantially helical in shape in the absence of an applied electrical voltage or external physical load. When a sufficient voltage is applied (e.g., via first and second electrodes 408, 410), flexible electroactive material 402 may deform from its initial helical shape (e.g., in the absence of an applied voltage) to a deformed state. The deformed state may include a change in shape in flexible electroactive material 402 along any dimension of the X, Y, or Z axis. In the presence of sufficient applied voltage, flexible electroactive material 402 may deform in multiple directions along the X, Y, and/or Z axis.

Flexible electroactive material 402 may include a single electroactive material (with or without an electrically insulating substrate material) in a so-called "unimorph" configuration, or may include a first electroactive material and a second electroactive material in a so-called "bimorph" configuration. In embodiments in which flexible electroactive material 402 is configured as a bimorph, an electrically conductive (e.g., a ground, an electrode, etc.) material and/or an electrically insulating material may be positioned between the first and second electroactive materials. In some examples, by arranging multiple layers of flexible electroactive material in parallel (e.g., stacking layers), the resulting actuation force may be multiplied and the stiffness of haptic vibrotactile actuator 400 may be increased.

Similar to the embodiment described above with respect to FIG. 1, haptic vibrotactile actuator 400 may include multiple layers (e.g., strips) of flexible electroactive material 402 positioned adjacent to and parallel to each other with an electrically insulating material positioned between each of the multiple layers of flexible electroactive materials 402.

In some examples, haptic vibrotactile actuator 400 may be directly attached and secured to a wearable article (e.g., the inside surface of a glove) and may be positioned and configured to apply haptic feedback (e.g., vibrations of varying frequency, intensity, pattern, etc.) to a user donning the article. Haptic vibrotactile actuator 400 may be capable of conforming to one or more features of a human body. For example, haptic vibrotactile actuator 400 may be integrated into a wearable article such as a sleeve, a cuff, or a finger of a glove. When integrated within a finger of a glove, a wearer's finger may be positioned along the Z axis such that haptic vibrotactile actuator 400 surrounds the wearer's finger. When a varying voltage waveform is applied to first and second electrodes 408, 410, haptic vibrotactile actuator 400 may deform or vibrate in any or all or directions along axis X, Y, or Z. The ability of haptic vibrotactile actuator 400 to surround a wearer's finger and vibrate in multiple directions may provide an increased level of control and user experience in haptic feedback when haptic vibrotactile actuator 400 is used, such as in an artificial-reality application.

Although the electromechanical coupling in flexible electroactive material 402 may be well-suited for haptic vibrotactile actuator 400, flexible electroactive material 402 may also be well-suited for applications such as wearable sensors. Haptic vibrotactile actuator 400 may have similar sensing characteristics and capabilities as described above with respect to haptic vibrotactile actuator 100 of FIG. 1.

Figure 5:
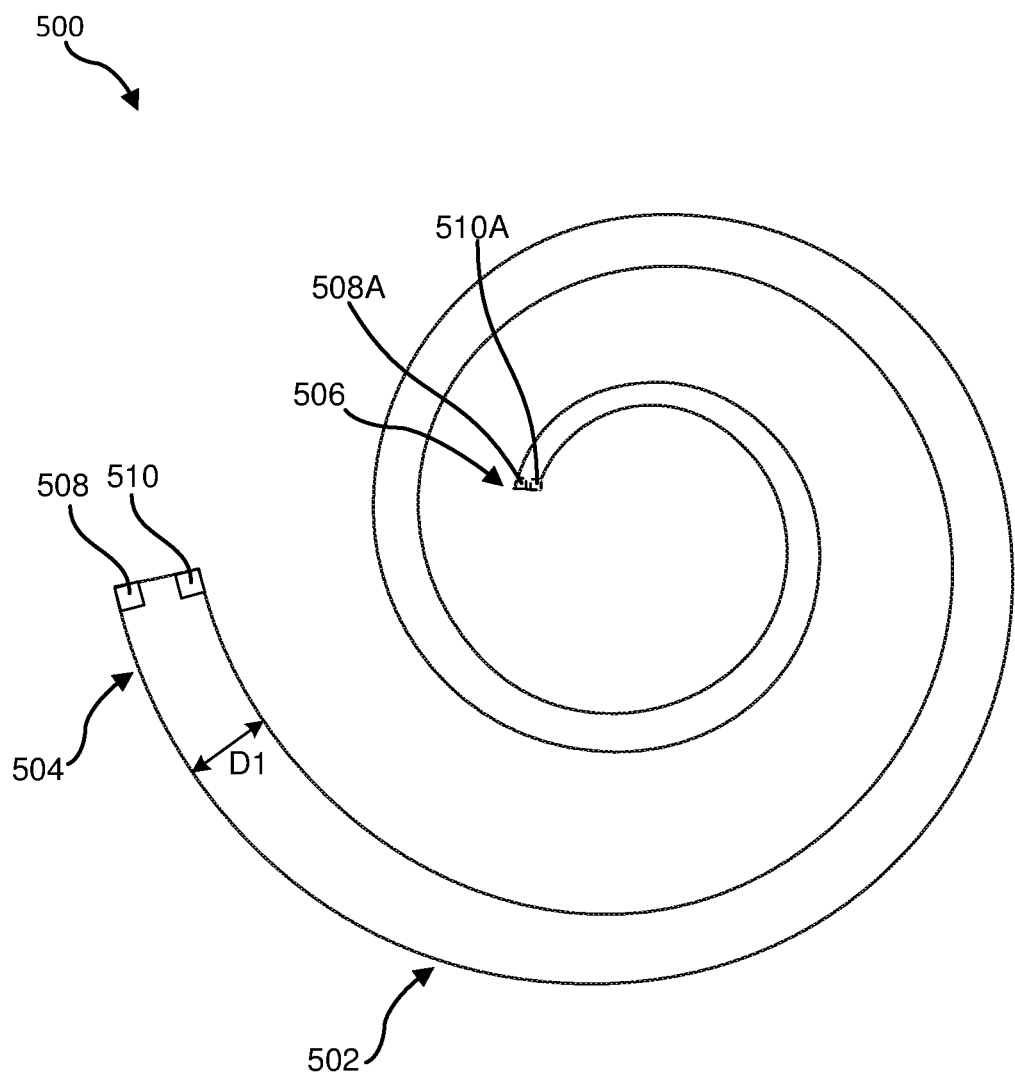
FIG. 5 is a plan view of a haptic vibrotactile actuator, according to at least one additional embodiment of the present disclosure.

FIG. 5 illustrates a haptic vibrotactile actuator 500 according to additional embodiments of the present disclosure. Similar to haptic vibrotactile actuator 100 described above with reference to FIG. 1, haptic vibrotactile actuator 500 of FIG. 5 may also include a flexible electroactive material 502 that has an outer end 504 and an inner end 506. A first electrode 508 may be electrically coupled to a first side (e.g., an upper side) of flexible electroactive material 502 and a second electrode 510 may be electrically coupled to a second, opposite side (e.g., a lower side) of flexible electroactive material 502. Thus, first electrode 508 and second electrode 510 may be positioned and/or configured to apply an electrical voltage to flexible electroactive material 502 to induce haptic vibration in flexible electroactive material 502.

As shown in FIG. 5, first electrode 508 and second electrode 510 may be positioned at or near outer end 504 of flexible electroactive material 502. Alternatively, a first electrode 508A and/or a second electrode 510A may be positioned at or near inner end 506 of flexible electroactive material 502, as shown by dashed lines in FIG. 5. First electrodes 508, 510 and/or second electrodes 508A, 510A may include an electrically conductive material, such as, without limitation, copper, gold, platinum, silver, palladium, or a combination thereof. Since flexible electroactive material 502 may deform, deflect, and/or vibrate when activated by an electrical voltage, in some embodiments first electrodes 508, 510 and/or second electrodes 508A, 510A may conform to the shape of flexible electroactive material 502. Thus, in some embodiments, first electrodes 508, 510 and/or second electrodes 508A, 510A may be compliant to flexible electroactive material 502 and may be capable of maintaining electrical contact with an interconnection mechanism (e.g., wires, harness, etc.) to a haptic actuator controller (e.g., haptic actuator controller 901 of FIG. 9) even at the deflections and vibrations encountered with spiral-shaped haptic vibrotactile actuators of the present disclosure.

Flexible electroactive material 502 may have the characteristics of flexible electroactive material 102 as described above including, without limitation: the ability to withstand external forces, the ability to deform out of plane in response to application of a sufficient voltage to first and second electrodes 508 and 510, configuration as a unimorph or bimorph construction, configuration as a stack of flexible electroactive materials separated by electrically insulating materials, attachment to a wearable article, a thickness of about 150 µm or less, the ability to conform to surfaces of different shapes, the ability to function as a sensing device, and substantial planarity in the absence of an applied electrical voltage or external physical load.

As illustrated in FIG. 5 by way of example, haptic vibrotactile actuator 500 may have a circular spiral shape. In some examples, haptic vibrotactile actuator 500 may have a variable lateral width D1 that varies across the length of flexible electroactive material 502 from outer end 504 to inner end 506. The example of FIG. 5 shows width D1 decreasing from outer end 504 to inner end 506. However, width D1 may decrease from inner end 506 to outer end 504. In additional examples, width D1 may both increase and decrease (e.g., once or multiple times) along the length of haptic vibrotactile actuator 500. Variable width D1 of haptic vibrotactile actuator 500 may affect (e.g., increase or decrease) the displacement, vibration characteristics, frequency response, actuation force, or a combination thereof across the length of haptic vibrotactile actuator 500 when an electrical voltage is applied to first and second electrodes 508 and 510. For example, outer end 504 may have a larger width D1 than inner end 506 thereby causing a larger displacement and/or force generated at outer end 504 when haptic vibrotactile actuator 500 is actuated. Varying the force and displacement across the length of haptic vibrotactile actuator 500 may provide an increased level of control and an alternative user experience in haptic feedback when haptic vibrotactile actuator 500 is used, such as in an artificial-reality application.

Haptic vibrotactile actuator 500 may also be well-suited for applications such as wearable sensors. Haptic vibrotactile actuator 500 may have similar sensing characteristics and capabilities as described above with respect to haptic vibrotactile actuator 100 of FIG. 1.

Figure 6:
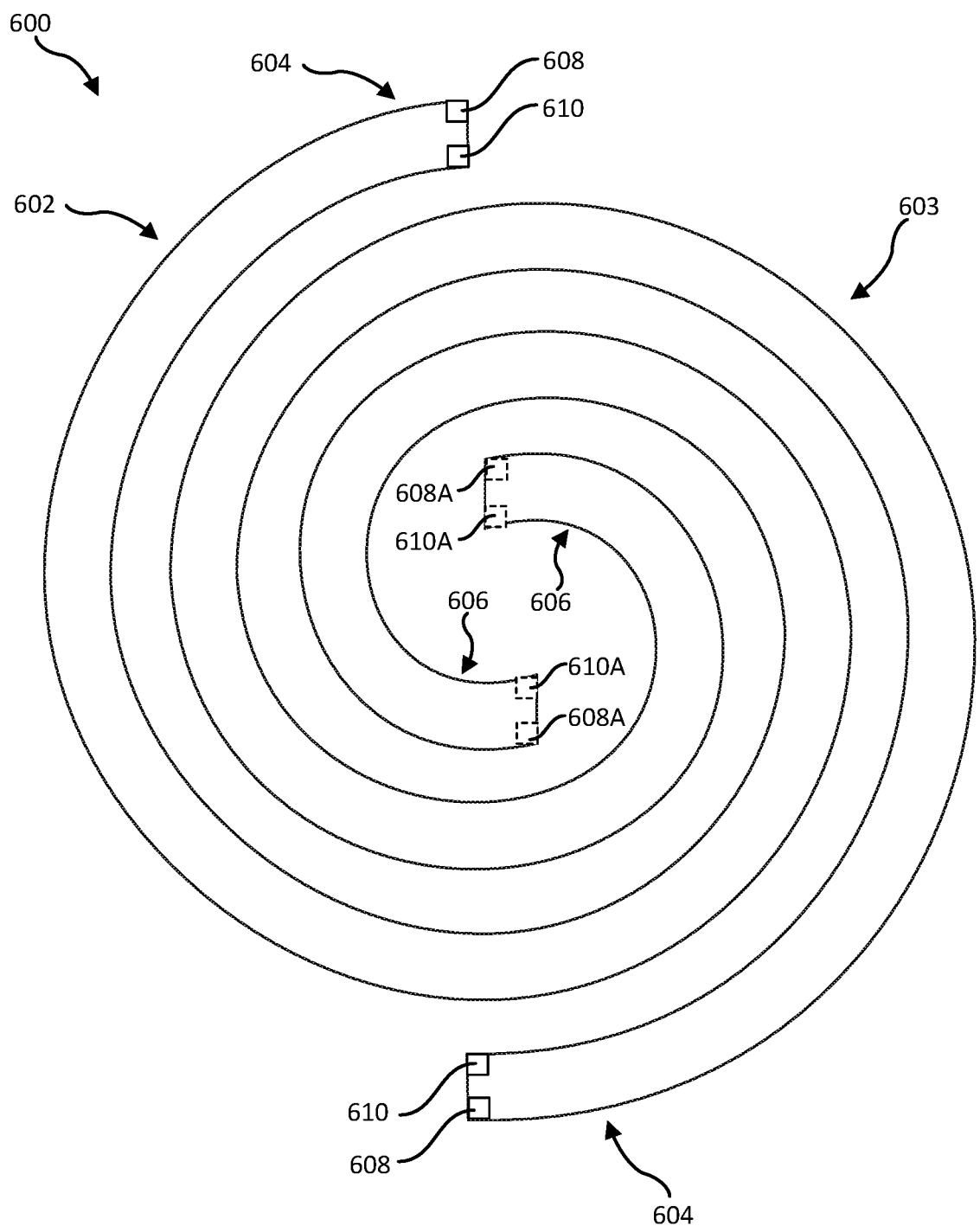
FIG. 6 is a plan view of a haptic vibrotactile actuator including two interleaved flexible electroactive materials, according to at least one additional embodiment of the present disclosure.

FIG. 6 illustrates a haptic vibrotactile actuator 600 according to additional embodiments of the present disclosure. Similar to haptic vibrotactile actuator 100 described above with reference to FIG. 1, haptic vibrotactile actuator 600 of FIG. 6 may also include a flexible electroactive material 602 that has an outer end 604 and an inner end 606. Additionally, haptic vibrotactile actuator 600 may include two segments of flexible electroactive material. Haptic vibrotactile actuator 600 may include a first flexible electroactive material 602 interleaved with a second flexible electroactive material 603 as shown in FIG. 6. First flexible electroactive material 602 may be interleaved with second flexible electroactive material 603 in the same plane such that first flexible electroactive material 602 is positioned substantially adjacent to second flexible electroactive material 603 in a concentric fashion.

Each of first flexible electroactive material 602 and second flexible electroactive material 603 may include a first electrode 608 electrically coupled to a first side (e.g., an upper side) of flexible electroactive material 602, 603 and a second electrode 610 electrically coupled to a second, opposite side (e.g., a lower side) of flexible electroactive material 602, 603. Thus, first electrodes 608 and second electrodes 610 may be positioned and/or configured to apply an electrical voltage to the respective flexible electroactive material 602, 603 to induce haptic vibration in flexible electroactive material 602, 603. As shown in FIG. 6, first electrodes 608 and second electrodes 610 may be positioned at or near outer end 604 of flexible electroactive material 602, 603. Alternatively, a first electrode 608A and/or a second electrode 610A may be positioned at or near inner end 606 of flexible electroactive material 602, 603 as shown by dashed lines in FIG. 6. First electrodes 608, 610 and/or second electrodes 608A, 610A may include an electrically conductive material, such as, without limitation, copper, gold, platinum, silver, palladium, or a combination thereof. Since flexible electroactive material 602, 603 may deform, deflect, and/or vibrate when activated by an electrical voltage, in some embodiments first electrodes 608, 610 and/or second electrodes 608A, 610A may conform to the shape of flexible electroactive material 602, 603. Thus, in some embodiments, first electrodes 608, 610 and/or second electrodes 608A, 610A may be compliant to flexible electroactive material 602, 603 and may be capable of maintaining electrical contact with an interconnection mechanism (e.g., wires, harness, etc.) to a haptic actuator controller (e.g., haptic actuator controller 901 of FIG. 9) even at the deflections and vibrations encountered with spiral-shaped haptic vibrotactile actuators of the present disclosure.

Flexible electroactive material 602 may have the characteristics of flexible electroactive material 102 as described above including, without limitation: the ability to withstand external forces, the ability to deform out of plane in response to application of a sufficient voltage to first and second electrodes 608 and 610, configuration as a unimorph or bimorph construction, configuration as a stack of flexible electroactive materials separated by electrically insulating materials, attachment to a wearable article, a thickness of about 150 µm or less, the ability to conform to surfaces of different shapes, the ability to function as a sensing device, and be substantial planarity in the absence of an applied electrical voltage or external physical load.

As illustrated in FIG. 6 by way of example, haptic vibrotactile actuator 600 may have a circular spiral shape. In some examples, haptic vibrotactile actuator 600 may have two interleaved flexible electroactive materials 602, 603. Each of flexible electroactive materials 602, 603 may have the same material and functional characteristics (e.g., the material and functional characteristics of flexible electroactive material 102) or each of flexible electroactive materials 602, 603 may have different material and functional characteristics. Further, flexible electroactive materials 602, 603 may be controlled in a similar fashion (e.g., same voltage waveform) or each of flexible electroactive materials 602, 603 may be separately and independently controlled (e.g., different voltage waveforms). By each of flexible electroactive materials 602, 603 having different characteristics (e.g., type of material, dimensions, stacking, etc.) and/or each of flexible electroactive materials 602, 603 being separately controlled, haptic vibrotactile actuator 600 may provide an increased level of control and an alternative user experience in haptic feedback when haptic vibrotactile actuator 600 is used, such as in an artificial-reality application as compared to a single flexible electroactive material.

Haptic vibrotactile actuator 600 may also be well-suited for applications such as wearable sensors. Haptic vibrotactile actuator 600 may have similar sensing characteristics and capabilities as described above with respect to haptic vibrotactile actuator 100 of FIG. 1.

Figure 7:
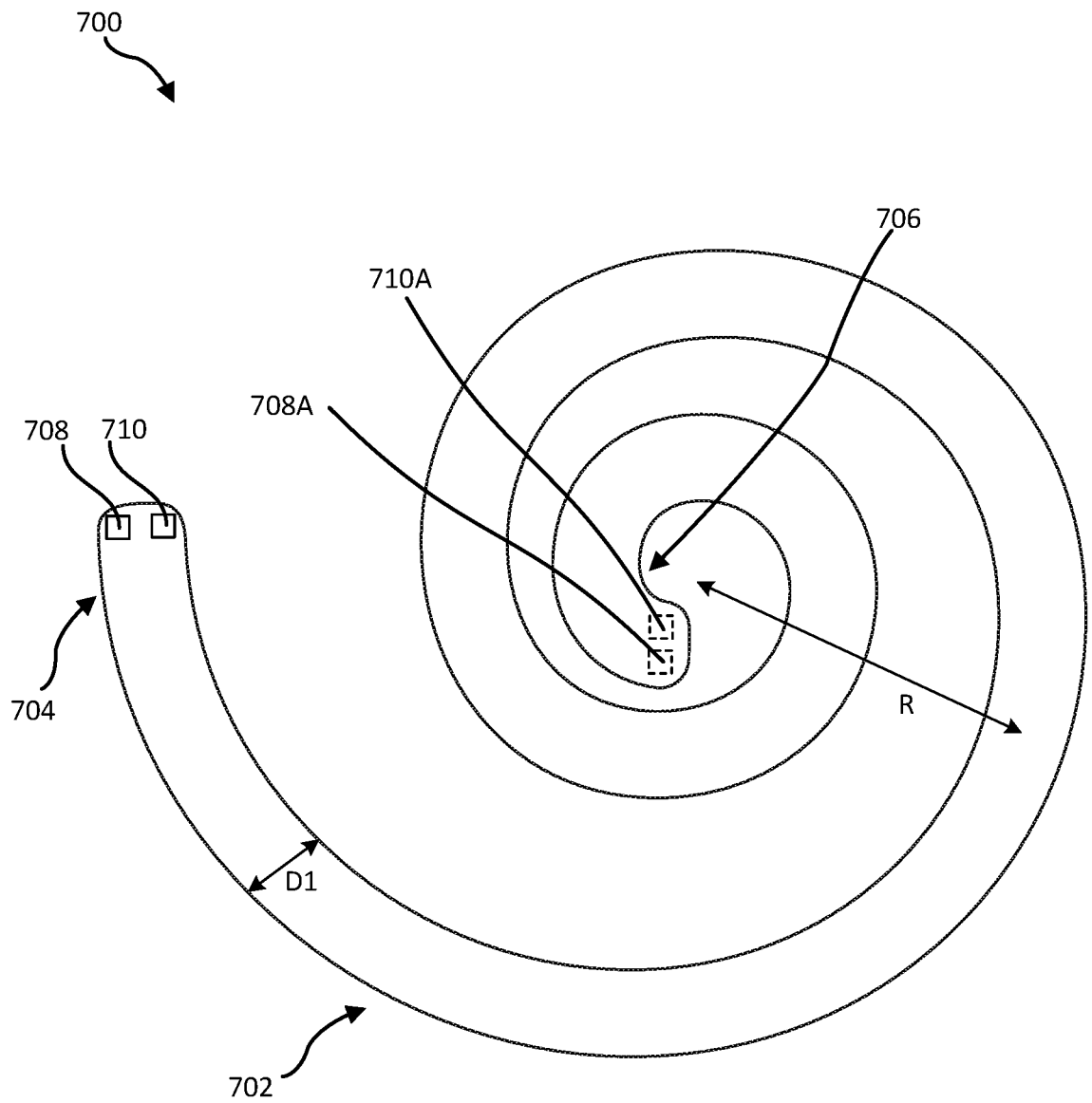
FIG. 7 is a plan view of a haptic vibrotactile actuator, according to at least one additional embodiment of the present disclosure.

FIG. 7 illustrates a haptic vibrotactile actuator 700 according to additional embodiments of the present disclosure. Similar to haptic vibrotactile actuator 100 described above with reference to FIG. 1, haptic vibrotactile actuator 700 of FIG. 7 may also include a flexible electroactive material 702 that has an outer end 704 and an inner end 706. A first electrode 708 may be electrically coupled to a first side (e.g., an upper side) of flexible electroactive material 702 and a second electrode 710 may be electrically coupled to a second, opposite side (e.g., a lower side) of flexible electroactive material 702. Thus, first electrode 708 and second electrode 710 may be positioned and/or configured to apply an electrical voltage to flexible electroactive material 702 to induce haptic vibration in flexible electroactive material 702.

As shown in FIG. 7, first electrode 708 and second electrode 710 may be positioned at or near outer end 704 of flexible electroactive material 702. Alternatively, a first electrode 708A and/or a second electrode 710A may be positioned at or near inner end 706 of flexible electroactive material 702, as shown by dashed lines in FIG. 7. First electrodes 708, 710 and/or second electrodes 708A, 710A may include an electrically conductive material, such as, without limitation, copper, gold, platinum, silver, palladium, or a combination thereof. Since flexible electroactive material 702 may deform, deflect, and/or vibrate when activated by an electrical voltage, in some embodiments first electrodes 708, 710 and/or second electrodes 708A, 710A may conform to the shape of flexible electroactive material 702. Thus, in some embodiments, first electrodes 708, 710 and/or second electrodes 708A, 710A may be compliant to flexible electroactive material 702 and may be capable of maintaining electrical contact with an interconnection mechanism (e.g., wires, harness, etc.) to a haptic actuator controller (e.g., haptic actuator controller 901 of FIG. 9) even at the deflections and vibrations encountered with spiral-shaped haptic vibrotactile actuators of the present disclosure.

Flexible electroactive material 702 may have the characteristics of flexible electroactive material 102 as described above including, without limitation: the ability to withstand external forces, the ability to deform out of plane in response to application of a sufficient voltage to first and second electrodes 708 and 710, configuration as a unimorph or bimorph construction, configuration as a stack of flexible electroactive materials separated by electrically insulating materials, attachment to a wearable article, a thickness of about 150 µm or less, the ability to conform to surfaces of different shapes, the ability to function as a sensing device, and substantial planarity in the absence of an applied electrical voltage or external physical load.

As illustrated in FIG. 7 by way of example, haptic vibrotactile actuator 700 may have a substantially circular spiral shape. In some examples, haptic vibrotactile actuator 700 may have a width D1 that is constant across the length of haptic vibrotactile actuator 700 from outer end 704 to inner end 706. Haptic vibrotactile actuator 700 may have a radius R that increases at a non-linear rate (e.g., logarithmic). The example of FIG. 7 shows radius R increasing at a nonlinear rate from inner end 706 to outer end 704. The shape of haptic vibrotactile actuator 700 (e.g., logarithmic spiral) may affect (e.g., increase or decrease) the displacement, vibration characteristics, frequency response, actuation force, or a combination thereof of haptic vibrotactile actuator 700 when an electrical voltage is applied to first and second electrodes 708 and 710. For example, the spirals of flexible electroactive material 702 near inner end 706 may be more tightly spaced than near outer end 704, which may result in a larger displacement and/or force generated near inner end 706 when haptic vibrotactile actuator 700 is actuated. Varying the displacement and/or force along the length of haptic vibrotactile actuator 700 may provide an increased level of control and an alternative user experience in haptic feedback when haptic vibrotactile actuator 700 is used, such as in an artificial-reality application.

Haptic vibrotactile actuator 700 may also be well-suited for applications such as wearable sensors. Haptic vibrotactile actuator 700 may have similar sensing characteristics and capabilities as described above with respect to haptic vibrotactile actuator 100 of FIG. 1.

FIG. 8 is a side schematic view of a haptic vibrotactile actuator in an activated state. As illustrated in FIG. 8, a haptic vibrotactile actuator 800 having a spiral configuration (e.g., as shown in any of FIGS. 1-7) may exhibit an increased displacement D out-of-plane upon actuation by a sufficient voltage (e.g., a voltage applied by haptic actuator driver 940 of FIG. 9) applied to first electrode 808 and second electrode 810 of haptic vibrotactile actuator 800, as compared to a similar actuator that may have a linear configuration in the same or similar space. For example, a linear actuator extending from a first end 804 of haptic vibrotactile actuator 800 to a second end 806A may exhibit a relatively small displacement $D_A$. However, haptic vibrotactile actuator 800 following a spiral path from first end 804 (e.g., an outer end) to a second end 806 (e.g., an inner end) may exhibit a relatively large displacement D, due to the increased length of haptic vibrotactile actuator 800 in the spiral configuration.

Displacement D of haptic vibrotactile actuator 800 may be determined at least in part by the characteristics of the flexible electroactive material used in haptic vibrotactile actuator 800. For example, displacement D may be determined in part by a combination of the following: the construction of the flexible electroactive material (e.g., unimorph or bimorph), the type of flexible electroactive material as described above with respect to FIG. 1 (e.g., an EAP material, a dielectric elastomer material, a piezoelectric material, etc.), the actuation voltage waveform (e.g., amplitude, frequency, driver impedance, etc.), stacking of flexible electroactive material, lateral width of flexible electroactive material, attachment method to a wearable article, and/or geometric configuration (e.g., circular spiral of FIG. 1, rectangular spiral of FIG. 3, helical spiral of FIG. 4, variable width spiral of FIG. 5, interleaved circular spirals of FIG. 6, nonlinear radius circular spiral of FIG. 7, etc.).

FIG. 9 is a block diagram of an artificial-reality system 900. Referring to FIG. 9, artificial-reality system 900 may, for example, be the augmented-reality system of FIG. 12 or FIG. 16 or the virtual-reality system of FIG. 13 or FIG. 15. Artificial-reality system 900 may present artificial-reality content (e.g., audio, video, etc.) to a user via head-mounted display system 905. Artificial-reality system 900 may also present haptic feedback to the user in temporal synchronization with the artificial-reality content. For example, head-mounted display system 905 may simultaneously present video content to a user on a display, audio content to a user through a speaker, and haptic feedback to a user through a wearable article with integrated haptic vibrotactile actuators. For example, a user may play a tennis game on an artificial-reality system that presents a virtual tennis ball moving towards the user as viewed on a head-mounted display screen and the user may swing a virtual tennis racket and make virtual contact with the tennis ball. Upon intended contact, the user may simultaneously see the virtual tennis ball contacting the racket and feel haptic feedback via a wearable article with integrated haptic vibrotactile actuators (e.g., a glove) that simulates the impact felt by a user contacting a tennis ball with a tennis racket. The user may also simultaneously hear a sound simulating contact of the ball with the racket. Providing video, audio, and haptic feedback in temporal synchrony to a user may create a multimodal sensory experience for the user, thereby increasing the immersiveness of the content consumed by the user.

FIG. 9 illustrates a block diagram of artificial-reality system 900 that includes a haptic vibrotactile actuator controller ("haptic controller") 901. Haptic controller 901 may include a local processor 920, an amplitude frequency controller 930, a haptic actuator driver 940, and a DC/DC converter 942. Haptic controller 901 may provide control signals (e.g., voltages of varying frequency, amplitude, duty cycle, etc.) for actuating haptic vibrotactile actuators 902(1)-902(n) in substantial temporal synchronization with content displayed on head-mounted display 905. Temporal synchronization between the audio, video and haptic feedback content may occur within a threshold time period (e.g., milliseconds) depending on latencies introduced in the communications and processing paths. Head-mounted display 905 may include a wireless communications unit (e.g., Bluetooth™, WiFi, NFC, etc.) for communicating control signals to local processor 920. The control signals may include haptic feedback content to be provided to a user in synchronization with content displayed on head-mounted display 905. Local processor (e.g., a microcontroller, a central processing unit, etc.) 920 may also include a wireless communications unit for receiving the control signals including haptic feedback content. Haptic controller 901 may be integrated into a wearable article (e.g., a glove) that includes haptic vibrotactile actuators 902(1)-902(n). Local processor 920 may decode the received control signals and provide the haptic feedback content to amplitude/frequency controller 930 (e.g., a digital signal processor, a microcontroller, etc.). Amplitude/frequency controller 930 may convert the haptic feedback content into voltage waveforms (e.g., sinewave, sawtooth, square, triangle, chirp, etc.) of varying amplitude, frequency, duty cycle, modulation (e.g., amplitude modulation, frequency modulation) and/or envelope that drives haptic vibrotactile actuators 902(1)-902(n) thereby providing haptic feedback to the user. Haptic actuator driver 940 may receive the voltage waveforms from amplitude/frequency controller 930 and condition the waveforms for driving haptic vibrotactile actuators 902(1)-902(n). Haptic actuator driver 940 may perform impedance matching, level shifting, amplification, etc., as required to drive haptic vibrotactile actuators 902(1)-902(n). In some examples, haptic vibrotactile actuators 902(1)-902(n) may require higher voltages for sufficient deformation and vibration. DC/DC converter 942 may convert electrical energy from a local power source (e.g., a battery, a kinetic energy harvester) to the higher voltages that may be required to drive haptic vibrotactile actuators 902(1)-902(n).

Haptic actuator driver 940 may apply the voltage waveforms for driving (e.g., actuating) haptic vibrotactile actuators 902(1)-902(n) to first electrodes 908 and/or second electrodes 910. In some examples, the voltage waveforms may be applied to one electrode (e.g., first electrode 908) while the other electrode (e.g., second electrode 910) is connected to ground. Alternatively, a differential voltage waveform may be applied to first electrode 908 and second electrode 910.

In some embodiments, a wearable article may include multiple (e.g., an array) of haptic vibrotactile actuators 902(1)-902(n). Haptic controller 901 may provide control signals for an array of haptic vibrotactile actuators 902(1)-902(n) distributed across the wearable article to provide different types and intensities of haptic feedback to a user. In some examples, artificial reality system 900 may include another haptic controller 901 that may provide control signals for another array of haptic vibrotactile actuators 902(1)-902(n) distributed across another wearable article (e.g., a pair of gloves worn by the user) that includes another flexible electroactive material. The other haptic controller 901 may also be communicatively coupled to head-mounted display system 905 and configured to apply another voltage to the other flexible electroactive material in temporal synchronization with the content presented on head-mounted display 905.

In some examples, haptic vibrotactile actuators 902(1)-902(n) may have a broadband frequency response and may be able to provide haptic feedback (e.g., haptic stimulus) to a human user across a wide range of frequencies. The range of frequencies of the haptic feedback may be in the range of 1 Hz to over 600 Hz. In some examples, haptic vibrotactile actuators 902(1)-902(n) may have a narrow-band frequency response based on the characteristics and spiral shapes described in detail above and may only provide haptic feedback to a human user across a narrow range of frequencies. Haptic vibrotactile actuators 902(1)-902(n) may be narrow-band actuators and each actuator may have a different frequency response band. Due to the resonance of the haptic actuator, each of haptic vibrotactile actuators 902(1)-902(n) may have a frequency band corresponding to its resonant frequency. In order to provide a wideband haptic feedback experience to a user, haptic vibrotactile actuators 902(1)-902(n) may each have a different frequency response band. In order to provide a wideband haptic feedback, haptic actuator driver 940 may control the frequency of voltage waveforms to match the frequency response characteristics of each of haptic vibrotactile actuators 902(1)-902(n) in order to create a more compelling experience for a user receiving the haptic feedback.

Any of haptic vibrotactile actuators 100, 200, 300, 400, 500, 600, and 700 described above may be supported by a wearable article (e.g., a glove, a pair of gloves, a headband, a sleeve, a bracelet, a watch band, a neck band, a sock, a shoe, a hat, etc.), such as any of the wearable articles described below with reference to FIGS. 11-16. Haptic vibrotactile actuator(s) 100, 200, 300, 400, 500, 600, and 700 may be supported in or on the wearable articles in a position to induce haptic vibrational feedback to a user (e.g., an intended user) when the wearable article is donned by the user.

FIG. 10 is a flow diagram illustrating a method 1000 of fabricating a wearable haptic system. At operation 1010, a flexible electroactive material may be formed to exhibit a substantially spiral shape, such as one of the shapes described above and/or shown in FIGS. 1-7. Operation 1010 may be performed in a variety of ways, such as by forming (e.g., inkjet printing, three-dimensional printing, forming through a stencil, silk screening, vapor deposition, etc.) the electroactive material in the spiral shape and/or by forming a bulk electroactive material and removing (e.g., via lithography, cutting, laser cutting, waterjet cutting, abrading, etc.) portions thereof to leave the spiral shape.

At operation 1020, a first electrode may be electrically coupled to a first side of the flexible electroactive material. Operation 1020 may be performed in a variety of ways. For example, a first conductive material may be applied to a portion of or to an entire surface of the first side of the electroactive material, or the electroactive material may be formed on the first conductive material.

At operation 1030, a second electrode may be electrically coupled to a second, opposite side of the flexible electroactive material. Operation 1030 may be performed in a variety of ways, such as described above with reference to operation 1020.

At operation 1040, the flexible electroactive material may be supported with a wearable article in a position to induce haptic vibrational feedback to an intended user, such as upon application of a voltage via the first electrode and the second electrode and when the wearable article is donned by the intended user. Operation 1040 may be performed in a variety of ways. For example, the electroactive material may be positioned in a palm portion of a glove, in a finger portion of a glove, in a wristband, in a sleeve, in a headband, in a sock, in a shoe, etc.

Accordingly, the present disclosure includes devices, systems, and methods that may be employed to improve and provide alternative modes of haptic vibrotactile sensations. For example, an artificial-reality system may include a wearable article(s) that includes haptic vibrotactile actuators. The haptic vibrotactile actuators may provide haptic vibrational feedback to an intended user when the wearable article is donned by the intended user. The haptic vibrational feedback may be synchronously provided to the intended user with audio/video content in order to create a more compelling artificial-reality experience. The haptic vibrotactile actuators may include a flexible electroactive material that has a substantially spiral shape. The haptic vibrotactile actuators may also include and first and second electrodes electrically coupled to opposing sides of the flexible electroactive material that may produce haptic vibration when electrically actuated. The spiral shape of the flexible electroactive material allows the haptic vibrotactile actuators of the present disclosure to have a greater displacement distance and provide more realistic haptic vibrational feedback to the intended user as compared to a similar actuator that may have a linear configuration in the same or similar space.

Embodiments of the present disclosure may include or be implemented in conjunction with various types of artificial-reality systems. Artificial reality is a form of reality that has been adjusted in some manner before presentation to a user, which may include, e.g., a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional (3D) effect to the viewer). Additionally, in some embodiments, artificial reality may also be associated with applications, products, accessories, services, or some combination thereof, that are used to, e.g., create content in an artificial reality and/or are otherwise used in (e.g., to perform activities in) an artificial reality.

Artificial-reality systems may be implemented in a variety of different form factors and configurations. Some artificial-reality systems may be designed to work without near-eye displays (NEDs), an example of which is augmented-reality system 1100 in FIG. 11. Other artificial-reality systems may include an NED that also provides visibility into the real world (e.g., augmented-reality system 1200 in FIG. 12) or that visually immerses a user in an artificial reality (e.g., virtual-reality system 1300 in FIG. 13). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 11:
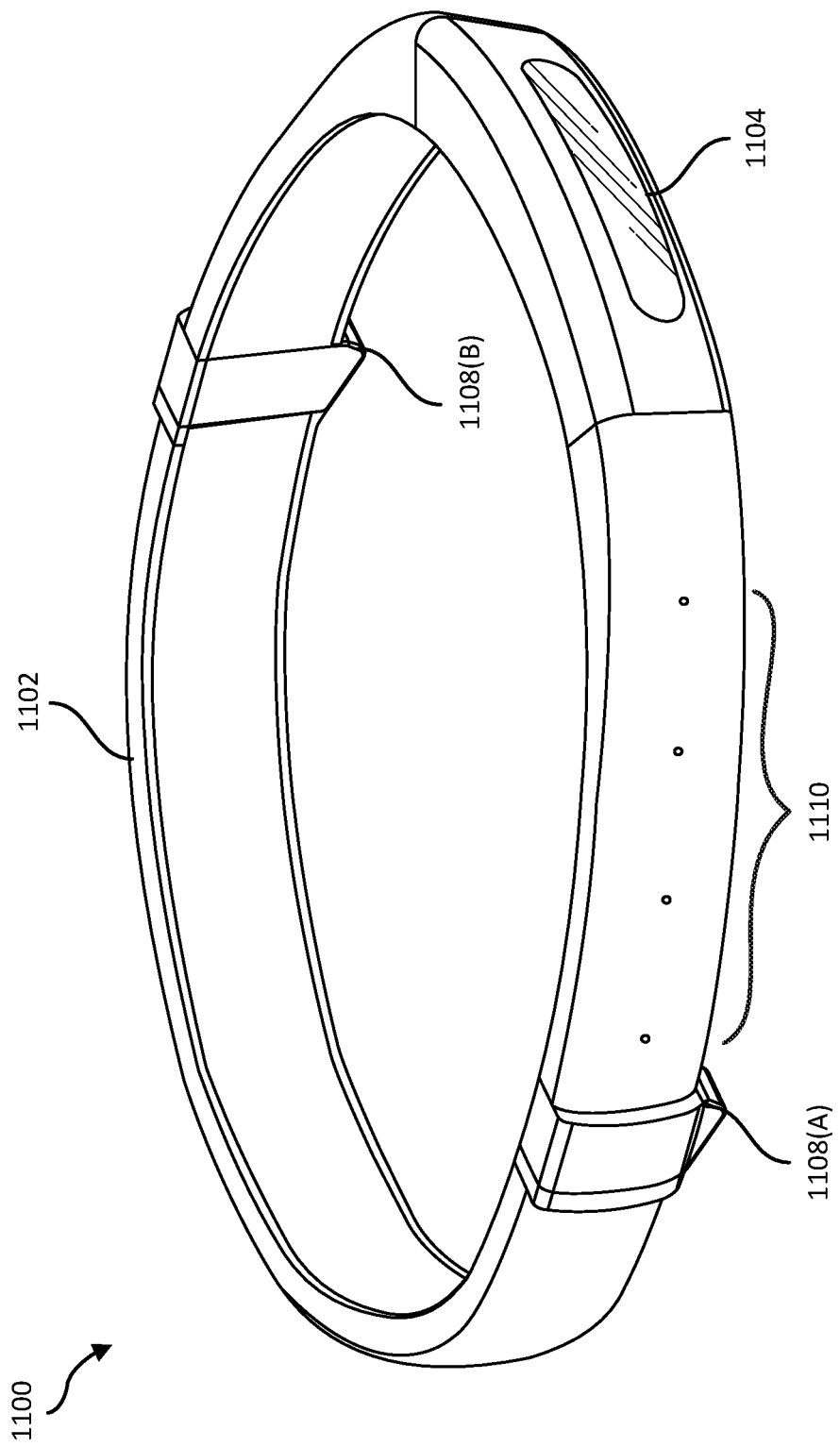
FIG. 11 is an illustration of an example artificial-reality headband that may be used in connection with embodiments of this disclosure.

Turning to FIG. 11, the augmented-reality system 1100 generally represents a wearable device dimensioned to fit about a body part (e.g., a head) of a user. As shown in FIG. 11, system 1100 may include a frame 1102 and a camera assembly 1104 that is coupled to frame 1102 and configured to gather information about a local environment by observing the local environment. Augmented-reality system 1100 may also include one or more audio devices, such as output audio transducers 1108(A) and 1108(B) and input audio transducers 1110. Output audio transducers 1108(A) and 1108(B) may provide audio feedback and/or content to a user, and input audio transducers 1110 may capture audio in a user's environment.

As shown, augmented-reality system 1100 may not necessarily include an NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1100 may not include an NED, augmented-reality system 1100 may include other types of screens or visual feedback devices (e.g., a display screen integrated into a side of frame 1102).

Figure 12:
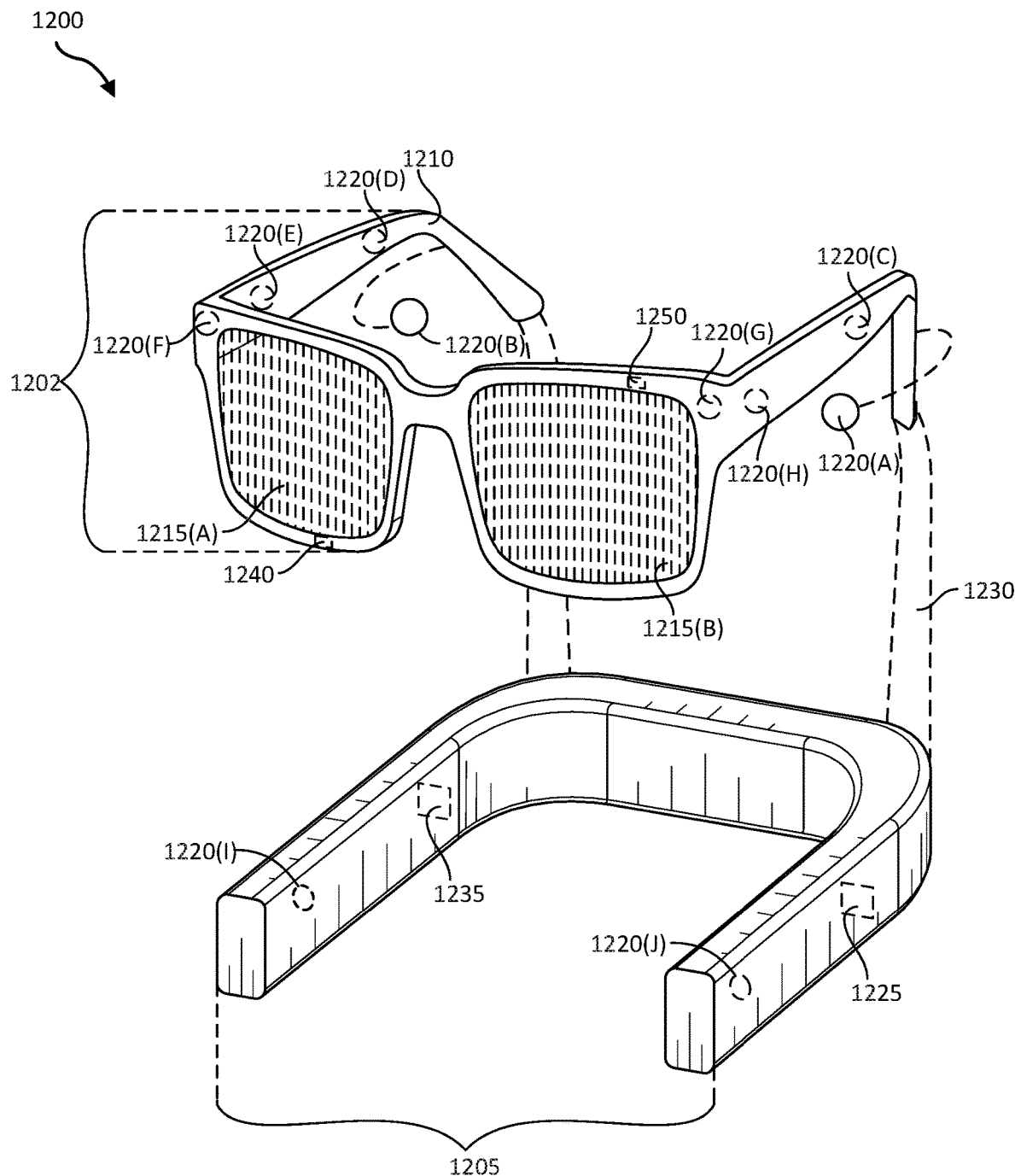
FIG. 12 is an illustration of example augmented-reality glasses that may be used in connection with embodiments of this disclosure.

The embodiments discussed in this disclosure may also be implemented in augmented-reality systems that include one or more NEDs. For example, as shown in FIG. 12, augmented-reality system 1200 may include an eyewear device 1202 with a frame 1210 configured to hold a left display device 1215(A) and a right display device 1215(B) in front of a user's eyes. Display devices 1215(A) and 1215(B) may act together or independently to present an image or series of images to a user. While augmented-reality system 1200 includes two displays, embodiments of this disclosure may be implemented in augmented-reality systems with a single NED or more than two NEDs.

In some embodiments, augmented-reality system 1200 may include one or more sensors, such as sensor 1240. Sensor 1240 may generate measurement signals in response to motion of augmented-reality system 1200 and may be located on substantially any portion of frame 1210. Sensor 1240 may represent a position sensor, an inertial measurement unit (IMU), a depth camera assembly, or any combination thereof. In some embodiments, augmented-reality system 1200 may or may not include sensor 1240 or may include more than one sensor. In embodiments in which sensor 1240 includes an IMU, the IMU may generate calibration data based on measurement signals from sensor 1240. Examples of sensor 1240 may include, without limitation, accelerometers, gyroscopes, magnetometers, other suitable types of sensors that detect motion, sensors used for error correction of the IMU, or some combination thereof. Augmented-reality system 1200 may also include a microphone array with a plurality of acoustic transducers 1220(A)-1220(J), referred to collectively as acoustic transducers 1220. Acoustic transducers 1220 may be transducers that detect air pressure variations induced by sound waves. Each acoustic transducer 1220 may be configured to detect sound and convert the detected sound into an electronic format (e.g., an analog or digital format). The microphone array in FIG. 12 may include, for example, ten acoustic transducers: 1220(A) and 1220(B), which may be designed to be placed inside a corresponding ear of the user, acoustic transducers 1220(C), 1220(D), 1220(E), 1220(F), 1220(G), and 1220(H), which may be positioned at various locations on frame 1210, and/or acoustic transducers 1220(1) and 1220(J), which may be positioned on a corresponding neckband 1205.

In some embodiments, one or more of acoustic transducers 1220(A)-(F) may be used as output transducers (e.g., speakers). For example, acoustic transducers 1220(A) and/or 1220(B) may be earbuds or any other suitable type of headphone or speaker.

The configuration of acoustic transducers 1220 of the microphone array may vary. While augmented-reality system 1200 is shown in FIG. 12 as having ten acoustic transducers 1220, the number of acoustic transducers 1220 may be greater or less than ten. In some embodiments, using higher numbers of acoustic transducers 1220 may increase the amount of audio information collected and/or the sensitivity and accuracy of the audio information. In contrast, using a lower number of acoustic transducers 1220 may decrease the computing power required by an associated controller 1250 to process the collected audio information. In addition, the position of each acoustic transducer 1220 of the microphone array may vary. For example, the position of acoustic transducer 1220 may include a defined position on the user, a defined coordinate on frame 1210, an orientation associated with each acoustic transducer 1220, or some combination thereof.

Acoustic transducers 1220(A) and 1220(B) may be positioned on different parts of the user's ear, such as behind the pinna or within the auricle or fossa. Or, there may be additional acoustic transducers 1220 on or surrounding the ear in addition to acoustic transducers 1220 inside the ear canal. Having acoustic transducer 1220 positioned next to an ear canal of a user may enable the microphone array to collect information on how sounds arrive at the ear canal. By positioning at least two of acoustic transducers 1220 on either side of a user's head (e.g., as binaural microphones), augmented-reality device 1200 may simulate binaural hearing and capture a 3D stereo sound field around about a user's head. In some embodiments, acoustic transducers 1220(A) and 1220(B) may be connected to augmented-reality system 1200 via a wired connection 1230, and in other embodiments, acoustic transducers 1220(A) and 1220(B) may be connected to augmented-reality system 1200 via a wireless connection (e.g., a Bluetooth connection). In still other embodiments, acoustic transducers 1220(A) and 1220(B) may not be used at all in conjunction with augmented-reality system 1200.

Acoustic transducers 1220 on frame 1210 may be positioned along the length of the temples, across the bridge, above or below display devices 1215(A) and 1215(B), or some combination thereof. Acoustic transducers 1220 may be oriented such that the microphone array is able to detect sounds in a wide range of directions surrounding the user wearing augmented-reality system 1200. In some embodiments, an optimization process may be performed during manufacturing of augmented-reality system 1200 to determine relative positioning of each acoustic transducer 1220 in the microphone array.

In some examples, augmented-reality system 1200 may include or be connected to an external device (e.g., a paired device), such as neckband 1205. Neckband 1205 generally represents any type or form of paired device. Thus, the following discussion of neckband 1205 may also apply to various other paired devices, such as charging cases, smart watches, smart phones, wrist bands, other wearable devices, hand-held controllers, tablet computers, laptop computers and other external compute devices, etc.

As shown, neckband 1205 may be coupled to eyewear device 1202 via one or more connectors. The connectors may be wired or wireless and may include electrical and/or non-electrical (e.g., structural) components. In some cases, eyewear device 1202 and neckband 1205 may operate independently without any wired or wireless connection between them. While FIG. 12 illustrates the components of eyewear device 1202 and neckband 1205 in example locations on eyewear device 1202 and neckband 1205, the components may be located elsewhere and/or distributed differently on eyewear device 1202 and/or neckband 1205. In some embodiments, the components of eyewear device 1202 and neckband 1205 may be located on one or more additional peripheral devices paired with eyewear device 1202, neckband 1205, or some combination thereof.

Pairing external devices, such as neckband 1205, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1200 may be provided by a paired device or shared between a paired device and an eyewear device, thus reducing the weight, heat profile, and form factor of the eyewear device overall while still retaining desired functionality. For example, neckband 1205 may allow components that would otherwise be included on an eyewear device to be included in neckband 1205 since users may tolerate a heavier weight load on their shoulders than they would tolerate on their heads. Neckband 1205 may also have a larger surface area over which to diffuse and disperse heat to the ambient environment. Thus, neckband 1205 may allow for greater battery and computation capacity than might otherwise have been possible on a standalone eyewear device. Since weight carried in neckband 1205 may be less invasive to a user than weight carried in eyewear device 1202, a user may tolerate wearing a lighter eyewear device and carrying or wearing the paired device for greater lengths of time than a user would tolerate wearing a heavy standalone eyewear device, thereby enabling users to more fully incorporate artificial-reality environments into their day-to-day activities.

Neckband 1205 may be communicatively coupled with eyewear device 1202 and/or to other devices. These other devices may provide certain functions (e.g., tracking, localizing, depth mapping, processing, storage, etc.) to augmented-reality system 1200. In the embodiment of FIG. 12, neckband 1205 may include two acoustic transducers (e.g., 1220(1) and 1220(J)) that are part of the microphone array (or potentially form their own microphone subarray). Neckband 1205 may also include a controller 1225 and a power source 1235.

Acoustic transducers 1220(1) and 1220(J) of neckband 1205 may be configured to detect sound and convert the detected sound into an electronic format (analog or digital). In the embodiment of FIG. 12, acoustic transducers 1220(1) and 1220(J) may be positioned on neckband 1205, thereby increasing the distance between neckband acoustic transducers 1220(1) and 1220(J) and other acoustic transducers 1220 positioned on eyewear device 1202. In some cases, increasing the distance between acoustic transducers 1220 of the microphone array may improve the accuracy of beamforming performed via the microphone array. For example, if a sound is detected by acoustic transducers 1220(C) and 1220(D) and the distance between acoustic transducers 1220(C) and 1220(D) is greater than, e.g., the distance between acoustic transducers 1220(D) and 1220(E), the determined source location of the detected sound may be more accurate than if the sound had been detected by acoustic transducers 1220(D) and 1220(E).

Controller 1225 of neckband 1205 may process information generated by the sensors on neckband 1205 and/or augmented-reality system 1200. For example, controller 1225 may process information from the microphone array that describes sounds detected by the microphone array. For each detected sound, controller 1225 may perform a direction-of-arrival (DOA) estimation to estimate a direction from which the detected sound arrived at the microphone array. As the microphone array detects sounds, controller 1225 may populate an audio data set with the information. In embodiments in which augmented-reality system 1200 includes an inertial measurement unit, controller 1225 may compute all inertial and spatial calculations from the IMU located on eyewear device 1202. A connector may convey information between augmented-reality system 1200 and neckband 1205 and between augmented-reality system 1200 and controller 1225. The information may be in the form of optical data, electrical data, wireless data, or any other transmittable data form. Moving the processing of information generated by augmented-reality system 1200 to neckband 1205 may reduce weight and heat in eyewear device 1202, making it more comfortable to the user.

A power source 1235 in neckband 1205 may provide power to eyewear device 1202 and/or to neckband 1205. Power source 1235 may include, without limitation, lithium ion batteries, lithium-polymer batteries, primary lithium batteries, alkaline batteries, or any other form of power storage. In some cases, power source 1235 may be a wired power source. Including power source 1235 on neckband 1205 instead of on eyewear device 1202 may help better distribute the weight and heat generated by power source 1235.

As noted, some artificial-reality systems may, instead of blending an artificial reality with actual reality, substantially replace one or more of a user's sensory perceptions of the real world with a virtual experience. One example of this type of system is a head-worn display system, such as virtual-reality system 1300 in FIG. 13, that mostly or completely covers a user's field of view. Virtual-reality system 1300 may include a front rigid body 1302 and a band 1304 shaped to fit around a user's head. Virtual-reality system 1300 may also include output audio transducers 1306(A) and 1306(B). Furthermore, while not shown in FIG. 13, front rigid body 1302 may include one or more electronic elements, including one or more electronic displays, one or more inertial measurement units (IMUS), one or more tracking emitters or detectors, and/or any other suitable device or system for creating an artificial reality experience.

Artificial-reality systems may include a variety of types of visual feedback mechanisms. For example, display devices in augmented-reality system 1200 and/or virtual-reality system 1300 may include one or more liquid crystal displays (LCDs), light-emitting diode (LED) displays, organic LED (OLED) displays, and/or any other suitable type of display screen. Artificial-reality systems may include a single display screen for both eyes or may provide a display screen for each eye, which may allow for additional flexibility for varifocal adjustments or for correcting a user's refractive error. Some artificial-reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial-reality systems may include one or more projection systems. For example, display devices in augmented-reality system 1200 and/or virtual-reality system 1300 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial-reality content and the real world. Artificial-reality systems may also be configured with any other suitable type or form of image projection system.

Artificial-reality systems may also include various types of computer vision components and subsystems. For example, augmented-reality system 1100, augmented-reality system 1200, and/or virtual-reality system 1300 may include one or more optical sensors, such as two-dimensional (2D) or 3D cameras, time-of-flight depth sensors, single-beam or sweeping laser rangefinders, 3D LiDAR sensors, and/or any other suitable type or form of optical sensor. An artificial-reality system may process data from one or more of these sensors to identify a location of a user, to map the real world, to provide a user with context about real-world surroundings, and/or to perform a variety of other functions.

Artificial-reality systems may also include one or more input and/or output audio transducers. In the examples shown in FIGS. 11 and 13, output audio transducers 1108 (A), 1108(B), 1306(A), and 1306(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1110 may include condenser microphones, dynamic microphones, ribbon microphones, and/or any other type or form of input transducer. In some embodiments, a single transducer may be used for both audio input and audio output.

Figure 13:
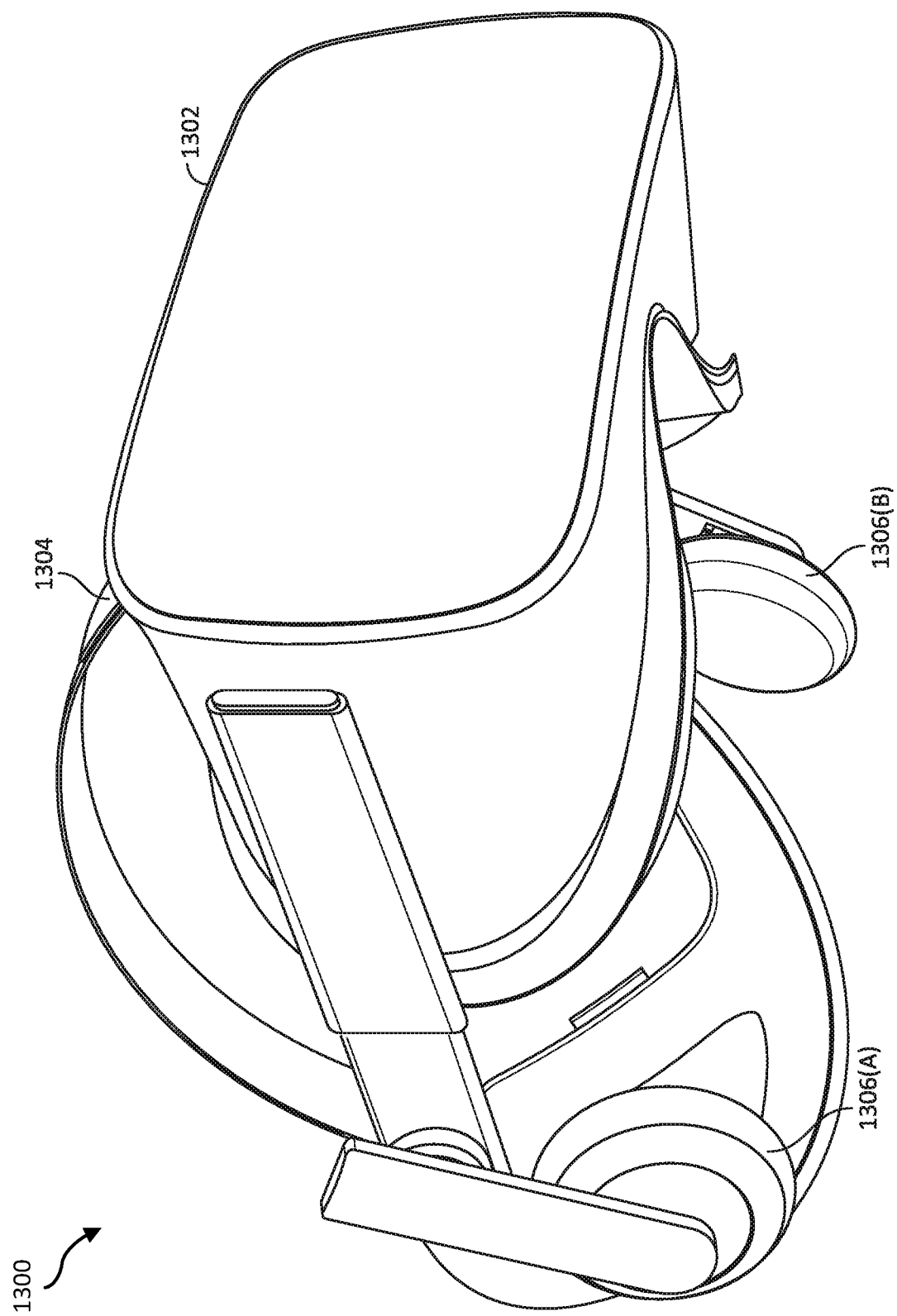
FIG. 13 is an illustration of an example virtual-reality headset that may be used in connection with embodiments of this disclosure.

While not shown in FIGS. 11-13, artificial-reality systems may include tactile (i.e., haptic) feedback systems, which may be incorporated into headwear, gloves, body suits, handheld controllers, environmental devices (e.g., chairs, floormats, etc.), and/or any other type of device or system. By way of example and not limitation, any of haptic vibrotactile actuators 100, 200, 300, 400, 500, 600, or 700 described above with reference to FIGS. 1-7 may be implemented in an artificial-reality system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial-reality devices, within other artificial-reality devices, and/or in conjunction with other artificial-reality devices.

By providing haptic sensations, audible content, and/or visual content, artificial-reality systems may create an entire virtual experience or enhance a user's real-world experience in a variety of contexts and environments. For instance, artificial-reality systems may assist or extend a user's perception, memory, or cognition within a particular environment. Some systems may enhance a user's interactions with other people in the real world or may enable more immersive interactions with other people in a virtual world. Artificial-reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial-reality experience in one or more of these contexts and environments and/or in other contexts and environments.

As noted, artificial-reality systems 1100, 1200, and 1300 may be used with a variety of other types of devices to provide a more compelling artificial-reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 14:
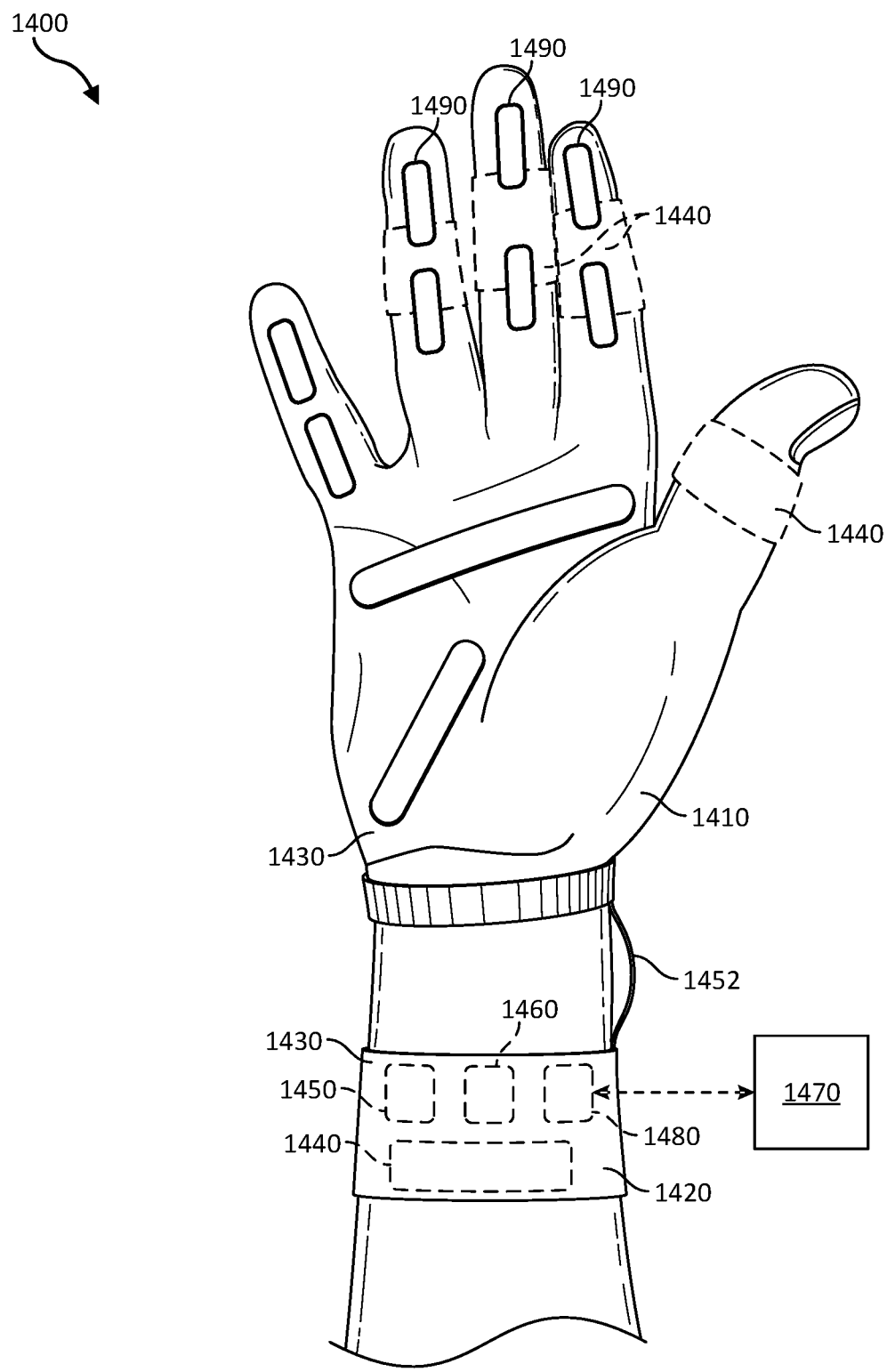
FIG. 14 is an illustration of example haptic devices that may be used in connection with embodiments of this disclosure.

Haptic feedback may be provided by interfaces positioned within a user's environment (e.g., chairs, tables, floors, etc.)

and/or interfaces on articles that may be worn or carried by a user (e.g., gloves, wristbands, etc.). As an example, FIG. 14 illustrates a vibrotactile system 1400 in the form of a wearable glove (haptic device 1410) and wristband (haptic device 1420). Haptic device 1410 and haptic device 1420 are shown as examples of wearable devices that include a flexible, wearable textile material 1430 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1440 may be positioned at least partially within one or more corresponding pockets formed in textile material 1430 of vibrotactile system 1400. Vibrotactile devices 1440 may be positioned in locations to provide a vibrating sensation (e.g., haptic feedback) to a user of vibrotactile system 1400. For example, vibrotactile devices 1440 may be positioned to be against the user's finger(s), thumb, or wrist, as shown in FIG. 14. Vibrotactile devices 1440 may, in some examples, be sufficiently flexible to conform to or bend with the user's corresponding body part(s).

A power source 1450 (e.g., a battery) for applying a voltage to vibrotactile devices 1440 for activation thereof may be electrically coupled to vibrotactile devices 1440, such as via conductive wiring 1452. In some examples, each of vibrotactile devices 1440 may be independently electrically coupled to power source 1450 for individual activation. In some embodiments, a processor 1460 may be operatively coupled to power source 1450 and configured (e.g., programmed) to control activation of vibrotactile devices 1440.

Vibrotactile system 1400 may be implemented in a variety of ways. In some examples, vibrotactile system 1400 may be a standalone system with integral subsystems and components for operation independent of other devices and systems. As another example, vibrotactile system 1400 may be configured for interaction with another device or system 1470. For example, vibrotactile system 1400 may, in some examples, include a communications interface 1480 for receiving and/or sending signals to the other device or system 1470. The other device or system 1470 may be a mobile device, a gaming console, an artificial-reality (e.g., virtual-reality, augmented-reality, mixed-reality) device, a personal computer, a tablet computer, a network device (e.g., a modem, a router, etc.), a handheld controller, etc. A communications interface 1480 may enable communications between vibrotactile system 1400 and the other device or system 1470 via a wireless (e.g., Wi-Fi, Bluetooth, cellular, radio, etc.) link or a wired link. If present, communications interface 1480 may be in communication with a processor 1460, such as to provide a signal to processor 1460 to activate or deactivate one or more of vibrotactile devices 1440.

Vibrotactile system 1400 may optionally include other subsystems and components, such as touch-sensitive pads 1490, pressure sensors, motion sensors, position sensors, lighting elements, and/or user interface elements (e.g., an on/off button, a vibration control element, etc.). During use, vibrotactile devices 1440 may be configured to be activated for a variety of different reasons, such as in response to the user's interaction with user interface elements, a signal from the motion or position sensors, a signal from touch-sensitive pads 1490, a signal from the pressure sensors, a signal from the other device or system 1470, etc.

Although power source 1450, processor 1460, and communications interface 1480 are illustrated in FIG. 14 as being positioned in haptic device 1420, the present disclosure is not so limited. For example, one or more of power source 1450, processor 1460, or communications interface 1480 may be positioned within haptic device 1410 or within another wearable textile.

Figure 15:
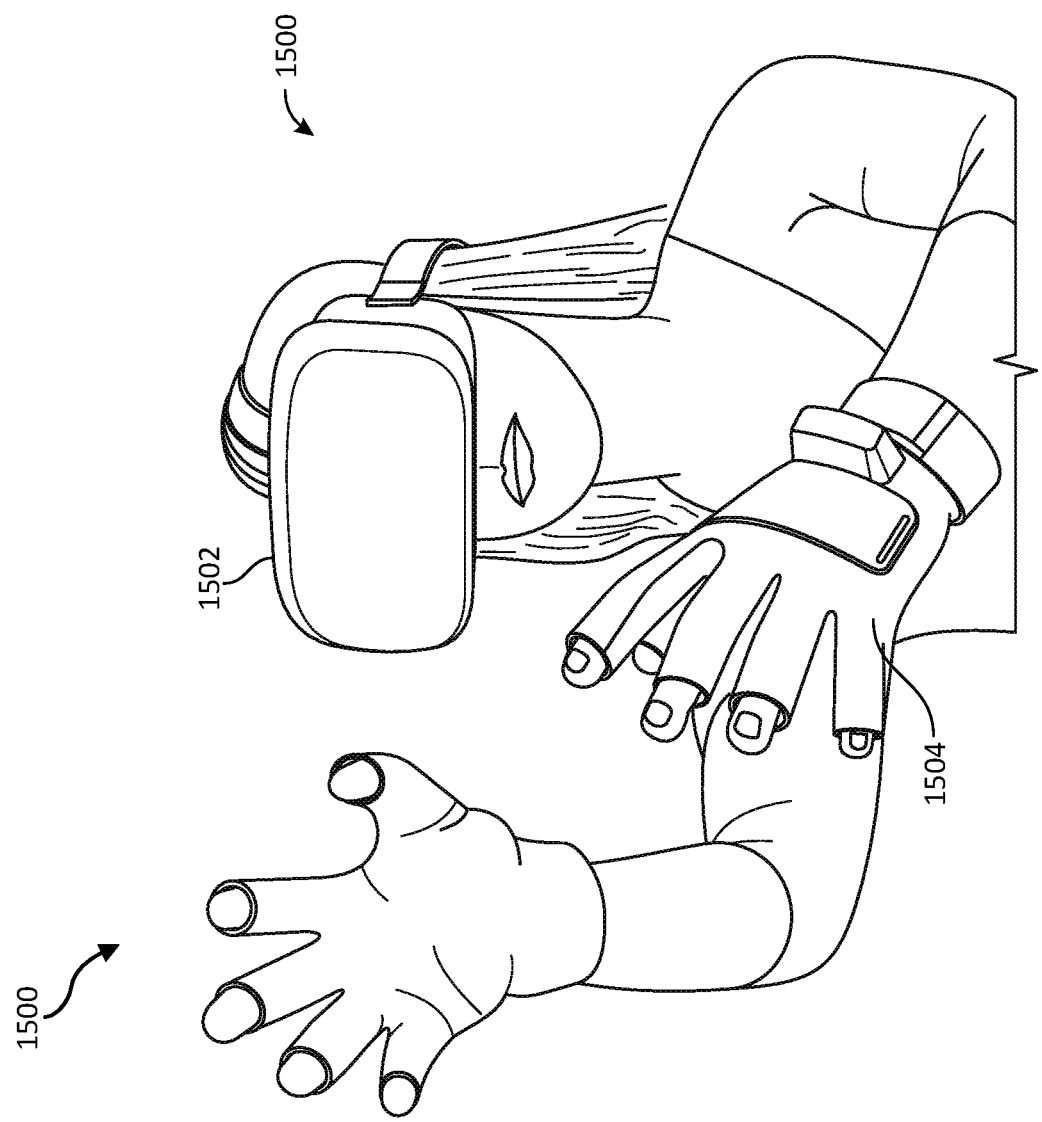
FIG. 15 is an illustration of an example virtual-reality environment according to embodiments of this disclosure.

Haptic wearables, such as those shown in and described in connection with FIG. 14, may be implemented in a variety of types of artificial-reality systems and environments. FIG. 15 shows an example artificial-reality environment 1500 including one head-mounted virtual-reality display and two haptic devices (i.e., gloves), and in other embodiments any number and/or combination of these components and other components may be included in an artificial-reality system. For example, in some embodiments there may be multiple head-mounted displays each having an associated haptic device, with each head-mounted display and each haptic device communicating with the same console, portable computing device, or other computing system.

Head-mounted display 1502 generally represents any type or form of virtual-reality system, such as virtual-reality system 1300 in FIG. 13. Haptic device 1504 generally represents any type or form of wearable device, worn by a use of an artificial-reality system, that provides haptic feedback to the user to give the user the perception that he or she is physically engaging with a virtual object. In some embodiments, haptic device 1504 may provide haptic feedback by applying vibration, motion, and/or force to the user. For example, haptic device 1504 may limit or augment a user's movement. To give a specific example, haptic device 1504 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 1504 to send action requests to a console. Examples of action requests include, without limitation, requests to start an application and/or end the application and/or requests to perform a particular action within the application.

Figure 16:
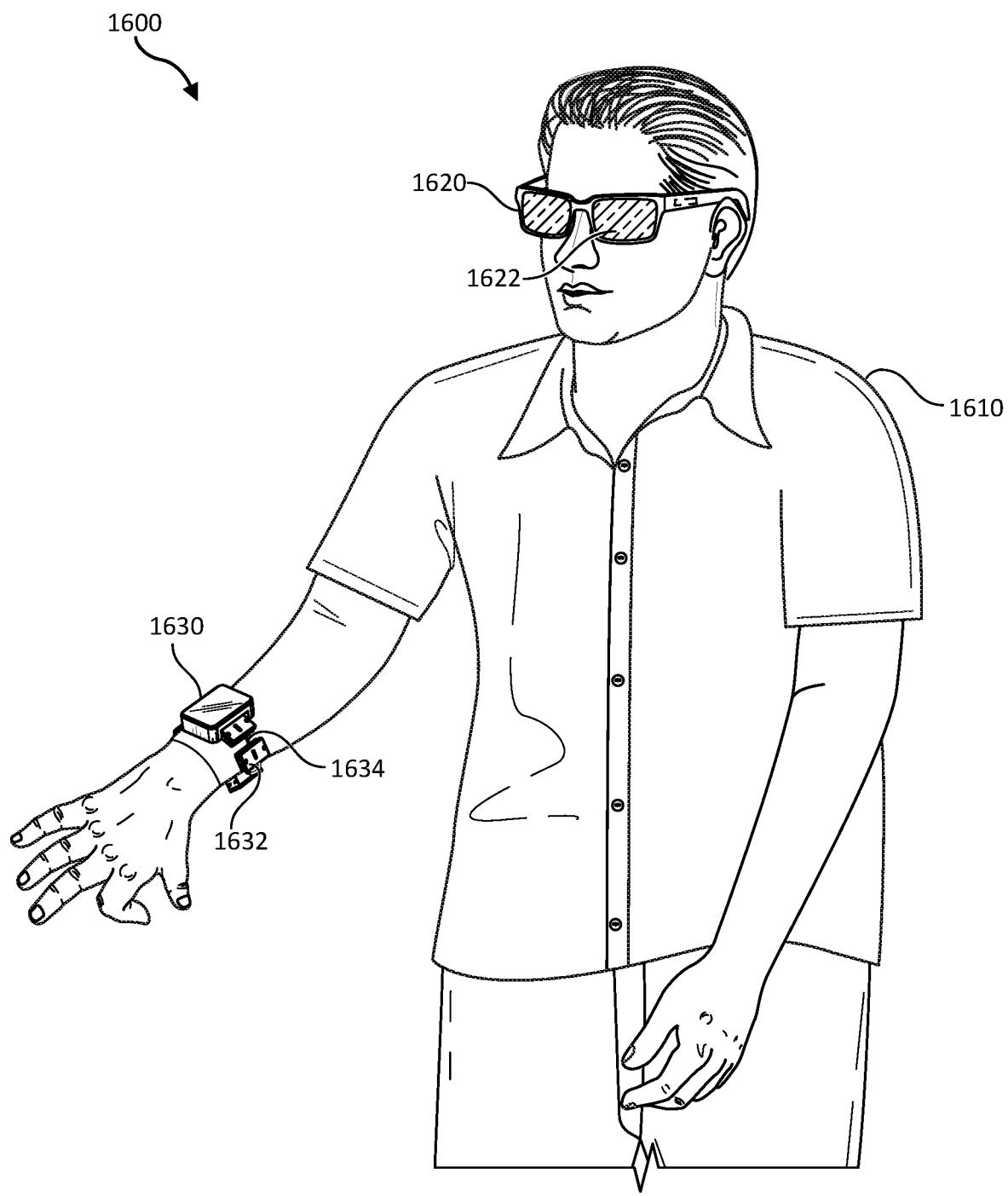
FIG. 16 is an illustration of an example augmented-reality environment according to embodiments of this disclosure.

While haptic interfaces may be used with virtual-reality systems, as shown in FIG. 15, haptic interfaces may also be used with augmented-reality systems, as shown in FIG. 16. FIG. 16 is a perspective view a user 1610 interacting with an augmented-reality system 1600. In this example, user 1610 may wear a pair of augmented-reality glasses 1620 that have one or more displays 1622 and that are paired with a haptic device 1630. Haptic device 1630 may be a wristband that includes a plurality of band elements 1632 and a tensioning mechanism 1634 that connects band elements 1632 to one another.

One or more of band elements 1632 may include any type or form of actuator suitable for providing haptic feedback. For example, one or more of band elements 1632 may be configured to provide one or more of various types of cutaneous feedback, including vibration, force, traction, texture, and/or temperature. To provide such feedback, band elements 1632 may include one or more of various types of actuators. In one example, each of band elements 1632 may include a vibrotactor (e.g., a vibrotactile actuator, such as any of actuators 100, 200, 300, 400, 500, 600, or 700 described above) configured to vibrate in unison or independently to provide one or more of various types of haptic sensations to a user. Alternatively, only a single band element or a subset of band elements may include vibrotactors.

Haptic devices 1410, 1420, 1504, and 1630 may include any suitable number and/or type of haptic transducer, sensor, and/or feedback mechanism. For example, haptic devices 1410, 1420, 1504, and 1630 may include one or more mechanical transducers, piezoelectric transducers, and/or fluidic transducers. Haptic devices 1410, 1420, 1504, and 1630 may also include various combinations of different types and forms of transducers that work together or independently to enhance a user's artificial-reality experience. In one example, each of band elements 1632 of haptic device 1630 may include a vibrotactor (e.g., a vibrotactile actuator) configured to vibrate in unison or independently to provide one or more of various types of haptic sensations to a user.

By way of non-limiting examples, the following embodiments are included in the present disclosure.

Example 1: An apparatus, comprising: a flexible electroactive material that has a substantially spiral shape; a first electrode electrically coupled to a first side of the flexible electroactive material; and a second electrode electrically coupled to a second, opposite side of the flexible electroactive material, wherein the first electrode and the second electrode are positioned and configured to apply an electrical voltage to the flexible electroactive material to induce haptic vibration in the flexible electroactive material.

Example 2: The apparatus of Example 1, wherein the first electrode and the second electrode are positioned at or near an outer end of the flexible electroactive material.

Example 3: The apparatus of Example 1 or Example 2, wherein the first electrode and the second electrode are positioned at or near an inner end of the flexible electroactive material.

Example 4: The apparatus of any of Examples 1 through 3, wherein the flexible electroactive material comprises at least one of: an electroactive polymer material; a dielectric elastomer material; a relaxor ferroelectric material; a piezoelectric ceramic material; a piezoelectric polycrystalline material; or a piezoelectric single-crystal material.

Example 5: The apparatus of any of Examples 1 through 4, wherein the flexible electroactive material has a thickness of less than 150 μm.

Example 6: The apparatus of any of Examples 1 through 5, wherein the flexible electroactive material comprises a first flexible electroactive material and a second flexible electroactive material separated from each other by at least an electrically insulating material.

Example 7: The apparatus of any of Examples 1 through 6, wherein the flexible electroactive material has a circular spiral shape.

Example 8: The apparatus of any of Examples 1 through 7, wherein the flexible electroactive material has a rectangular spiral shape.

Example 9: The apparatus of any of Examples 1 through 8, wherein the flexible electroactive material has a variable lateral width over the length of the flexible electroactive material.

Example 10: The apparatus of any of Examples 1 through 9, further comprising another flexible electroactive material having a substantially spiral shape, wherein the flexible electroactive material is interleaved with the other flexible electroactive material.

Example 11: The apparatus of any of Examples 1 through 10, wherein the flexible electroactive material has a substantially planar spiral shape in absence of the applied electrical voltage or in absence of an external physical load.

Example 12: The apparatus of any of Examples 1 through 11, wherein the flexible electroactive material exhibits a substantially conical spiral shape in response to the applied electrical voltage.

Example 13: A system, comprising: a flexible electroactive material that has a substantially spiral shape and that is configured to vibrate upon application of a voltage thereto; and a wearable article supporting the flexible electroactive material positioned to induce haptic vibrational feedback to an intended user donning the wearable article.

Example 14: The system of Example 13, wherein the wearable article comprises at least one of: a glove; a headband; a sleeve; a bracelet; a watch band; a sock; a shoe; a neck band; a shirt; eyewear; a vest; a belt; or a hat.

Example 15: The system of Example 13 or Example 14, wherein the flexible electroactive material has a substantially planar spiral shape in absence of an applied electrical voltage or in absence of an external physical load.

Example 16: The system of any of Examples 13 through 15, wherein the flexible electroactive material is configured to vibrate in a direction out-of-plane relative to the substantially planar spiral shape.

Example 17: The system of any of Examples 13 through 16, wherein the flexible electroactive material is configured to vibrate: in a first direction out-of-plane relative to the substantially planar spiral shape; and in a second direction different from the first direction and out-of-plane relative to the substantially planar spiral shape.

Example 18: The system of any of Examples 13 through 17, further comprising a controller and a head-mounted display, wherein the controller is communicatively coupled to the head-mounted display and is configured to apply the voltage to the flexible electroactive material in temporal synchronization with content presented on the head-mounted display.

Example 19: The system of any of Examples 13 through 18, further comprising another article supporting another flexible electroactive material and another controller, wherein the other controller is communicatively coupled to the head-mounted display and is configured to apply another voltage to the other flexible electroactive material in temporal synchronization with the content presented on the head-mounted display.

Example 20: A method comprising: forming a flexible electroactive material to exhibit a substantially spiral shape; electrically coupling a first electrode to a first side of the flexible electroactive material; electrically coupling a second electrode to a second, opposite side of the flexible electroactive material; and supporting the flexible electroactive material with a wearable article in a position to induce haptic vibrational feedback to an intended user donning the wearable article upon application of a voltage via the first electrode and the second electrode.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

The preceding description has been provided to enable others skilled in the art to best utilize various aspects of the example embodiments disclosed herein. This example description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus, comprising:
   a flexible electroactive material that has a spiral shape;
   a first electrode electrically coupled to a first side of the flexible electroactive material; and
   a second electrode electrically coupled to a second, opposite side of the flexible electroactive material, wherein the first electrode and the second electrode are positioned and configured to apply an electrical voltage to the flexible electroactive material to induce haptic vibration in the flexible electroactive material,
   wherein the flexible electroactive material exhibits a conical spiral shape in response to the applied electrical voltage.

2. The apparatus of claim 1, wherein the first electrode and the second electrode are positioned at or near an outer end of the flexible electroactive material.

3. The apparatus of claim 1, wherein the first electrode and the second electrode are positioned at or near an inner end of the flexible electroactive material.

4. The apparatus of claim 1, wherein the flexible electroactive material comprises at least one of:
   an electroactive polymer material;
   a dielectric elastomer material;
   a relaxor ferroelectric material;
   a piezoelectric ceramic material;
   a piezoelectric polycrystalline material; or
   a piezoelectric single-crystal material.

5. The apparatus of claim 1, wherein the flexible electroactive material has a thickness of less than approximately 150 µm.

6. The apparatus of claim 1, wherein the flexible electroactive material comprises a first flexible electroactive material and a second flexible electroactive material separated from each other by at least an electrically insulating material.

7. The apparatus of claim 1, wherein the flexible electroactive material has a circular spiral shape.

8. The apparatus of claim 1, wherein the flexible electroactive material has a rectangular spiral shape.

9. The apparatus of claim 1, wherein the flexible electroactive material has a variable lateral width over the length of the flexible electroactive material.

10. The apparatus of claim 1, further comprising another flexible electroactive material having a spiral shape, wherein the flexible electroactive material is interleaved with the other flexible electroactive material.

11. The apparatus of claim 1, wherein the flexible electroactive material has a planar spiral shape in absence of the applied electrical voltage or in absence of an external physical load.

12. A system, comprising:
    a flexible electroactive material that has a spiral shape and that is configured to vibrate and expand into a conical spiral shape upon application of a voltage thereto; and
    a wearable article supporting the flexible electroactive material positioned to induce haptic vibrational feedback to an intended user donning the wearable article.

13. The system of claim 12, wherein the wearable article comprises at least one of:
    a glove;
    a headband;
    a sleeve;
    a bracelet;
    a watch band;
    a sock;
    a shoe;
    a neck band;
    a shirt;
    eyewear;
    a vest;
    a belt; or
    a hat.

14. The system of claim 12, wherein the flexible electroactive material has a planar spiral shape in absence of an applied electrical voltage or in absence of an external physical load.

15. The system of claim 14, wherein the flexible electroactive material is configured to vibrate in a direction out-of-plane relative to the planar spiral shape.

16. The system of claim 14, wherein the flexible electroactive material is configured to vibrate:
    in a first direction out-of-plane relative to the planar spiral shape; and
    in a second direction different from the first direction and out-of-plane relative to the planar spiral shape.

17. The system of claim 12, further comprising a controller and a head-mounted display, wherein the controller is communicatively coupled to the head-mounted display and is configured to apply the voltage to the flexible electroactive material in temporal synchronization with content presented on the head-mounted display.

18. The system of claim 17, further comprising another article supporting another flexible electroactive material and another controller, wherein the other controller is communicatively coupled to the head-mounted display and is configured to apply another voltage to the other flexible electroactive material in temporal synchronization with the content presented on the head-mounted display.

19. A method comprising:
    forming a flexible electroactive material to exhibit a substantially spiral shape;
    electrically coupling a first electrode to a first side of the flexible electroactive material;
    electrically coupling a second electrode to a second, opposite side of the flexible electroactive material; and
    supporting the flexible electroactive material with a wearable article in a position to induce haptic vibrational feedback to an intended user donning the wearable article upon application of a voltage via the first electrode and the second electrode such that the flexible electroactive material is configured to deform into a conical spiral shape upon application of the voltage.

* * * * *